(12) United States Patent
Takada et al.

(10) Patent No.: US 8,273,585 B2
(45) Date of Patent: Sep. 25, 2012

(54) OPTICAL SEMICONDUCTOR DEVICE AND METHOD FOR MANUFACTURING THE SAME

(75) Inventors: Kan Takada, Kawasaki (JP); Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/314,874

(22) Filed: Dec. 8, 2011

(65) Prior Publication Data
US 2012/0083058 A1 Apr. 5, 2012

Related U.S. Application Data

(60) Division of application No. 12/222,915, filed on Aug. 19, 2008, now Pat. No. 8,093,581, which is a continuation of application No. PCT/JP2006/302975, filed on Feb. 20, 2006.

(51) Int. Cl.
*H01L 33/58* (2010.01)

(52) U.S. Cl. ........................................................ 438/22

(58) Field of Classification Search .................... 438/22, 438/31, 27, 29, 32; 257/E33.068
See application file for complete search history.

(56) References Cited

U.S. PATENT DOCUMENTS

| | | | |
|---|---|---|---|
| 5,859,866 A * | 1/1999 | Forrest et al. | 372/50.124 |
| 5,914,496 A | 6/1999 | Thijs et al. | |
| 5,920,079 A | 7/1999 | Shimizu et al. | |
| 6,711,191 B1 * | 3/2004 | Kozaki et al. | 372/43.01 |
| 6,737,718 B2 | 5/2004 | Takeuchi | |
| 6,853,661 B2 | 2/2005 | Ekawa | |
| 6,925,103 B2 * | 8/2005 | Ishikawa et al. | 372/96 |
| 6,940,100 B2 * | 9/2005 | Tsujimura et al. | 257/98 |
| 7,020,375 B2 | 3/2006 | Nakaji et al. | |
| 7,038,233 B2 | 5/2006 | Tsuchiya et al. | |
| 7,197,057 B2 | 3/2007 | Hwang | |
| 2003/0063646 A1 | 4/2003 | Yoshida | |
| 2004/0159847 A1 | 8/2004 | Kondo et al. | |

FOREIGN PATENT DOCUMENTS

| | | |
|---|---|---|
| JP | 08-125263 | 5/1996 |
| JP | 8-172241 | 7/1996 |
| JP | 11-506273 | 6/1999 |
| JP | 2000-312051 | 11/2000 |
| JP | 2001-189523 | 7/2001 |
| JP | 2002-344085 | 11/2002 |
| JP | 2003-86899 | 3/2003 |
| JP | 2003-114407 | 4/2003 |

(Continued)

OTHER PUBLICATIONS

International Search Report for PCT/JP2006/302975, mailed Mar. 28, 2006.

(Continued)

*Primary Examiner* — Thao Le
(74) *Attorney, Agent, or Firm* — Fujitsu Patent Center

(57) ABSTRACT

There is provided an optical semiconductor device having a first optical semiconductor element including an InP substrate, a lower cladding layer formed on the InP substrate, a lower optical guide layer which is formed on the lower cladding layer and is composed of AlGaInAs, an active layer which is formed on the lower optical guide layer and has a multiple quantum well structure where a well layer and a barrier layer that is formed of AlGaInAs are alternately stacked, an upper optical guide layer which is formed on the active layer and is composed of InGaAsP, and an upper cladding layer formed on the upper optical guide layer.

8 Claims, 20 Drawing Sheets

FOREIGN PATENT DOCUMENTS

| | | |
|---|---|---|
| JP | 2003-174223 | 6/2003 |
| JP | 2005-129686 | 5/2005 |

OTHER PUBLICATIONS

USPTO, (LE) Notice of Allowance and Notice of Allowability, Oct. 5, 2011, in U.S. Appl. No. 12/222,915 [now allowed].

USPTO, (LE) Notice of Allowance and Notice of Allowability, Aug. 5, 2011, in U.S. Appl. No. 12/222,915 [now allowed].

USPTO, (LE) Non-Final Office Action, Apr. 26, 2011, in U.S. Appl. No. 12/222,915 [now allowed].

USPTO, (LE) Non-Final Office Action, Nov. 8, 2010, in U.S. Appl. No. 12/222,915 [now allowed].

USPTO, (LE) Restriction Requirement, Aug. 25, 2010, in U.S. Appl. No. 12/222,915 [now allowed].

Japanese Office Action mailed Nov. 1, 2011 for corresponding Japanese Application No. 2008-501498, with partial English-language translation.

* cited by examiner

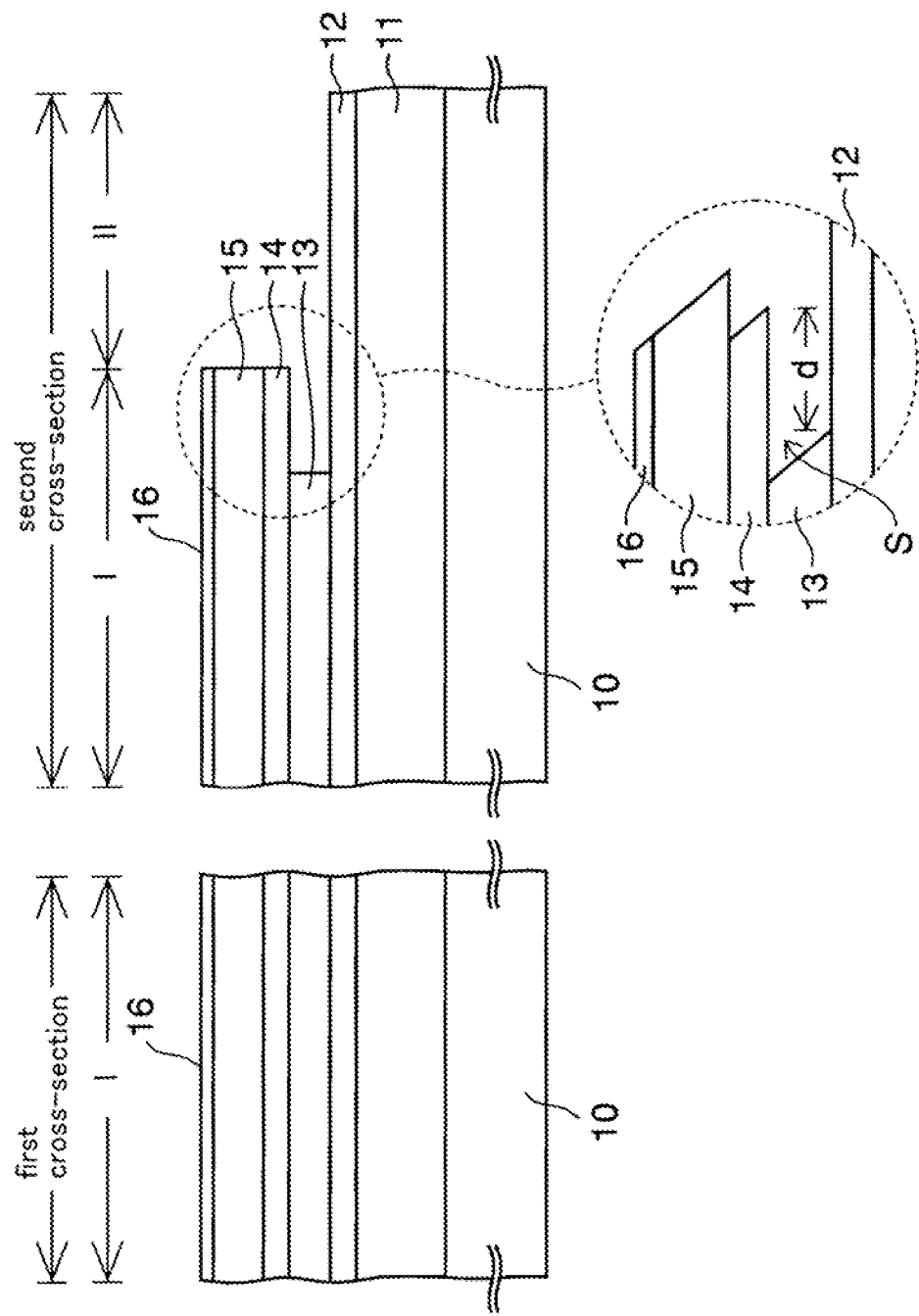

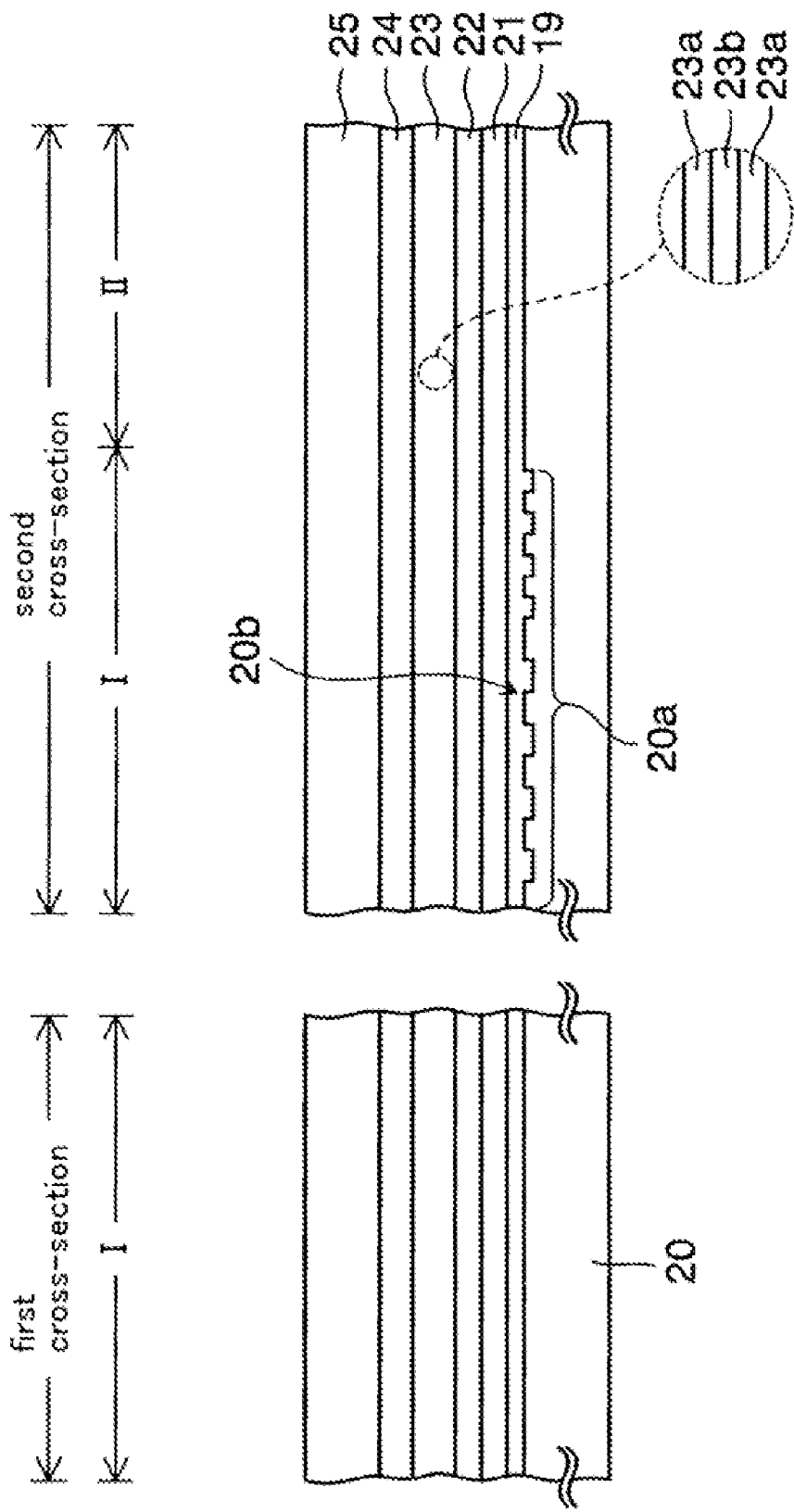

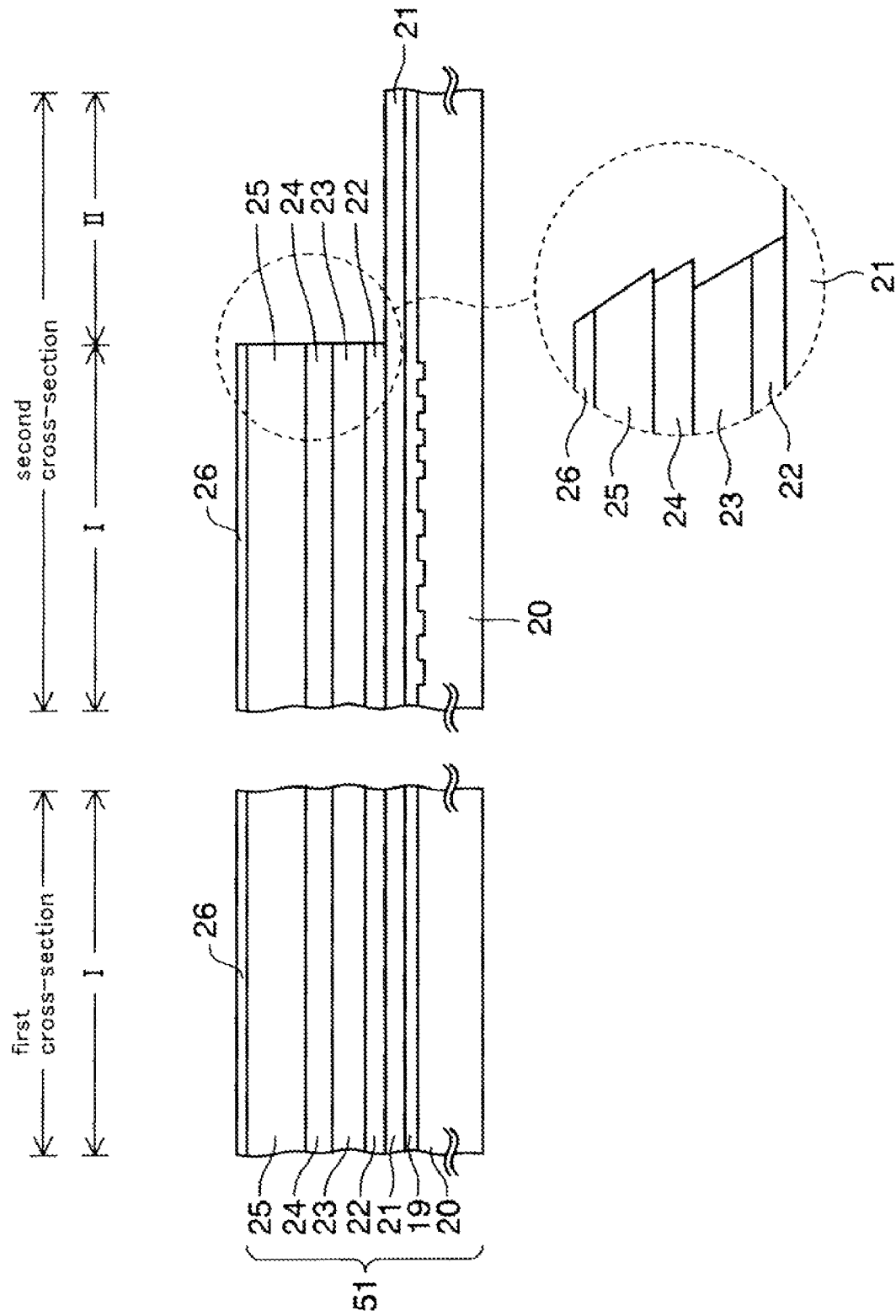

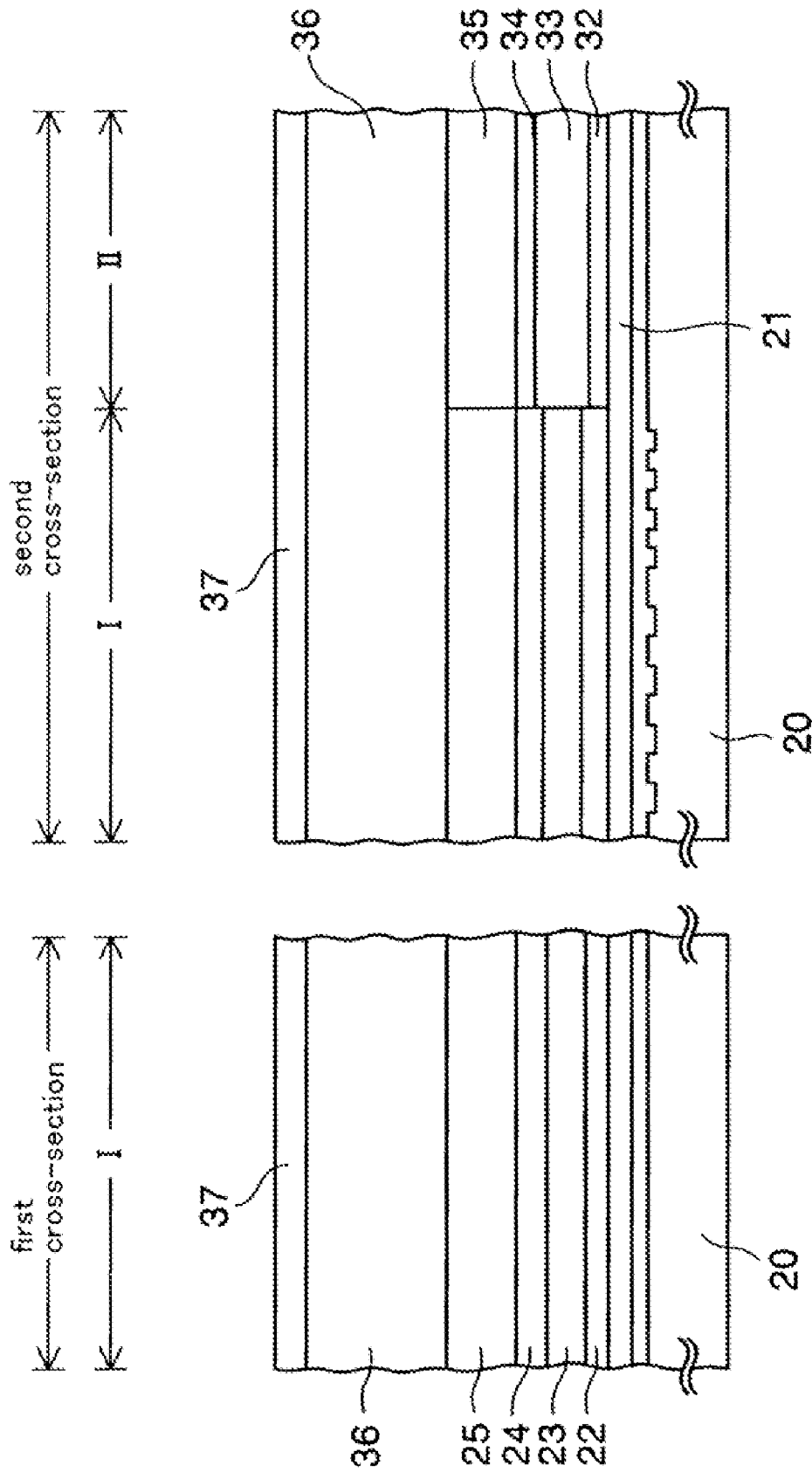

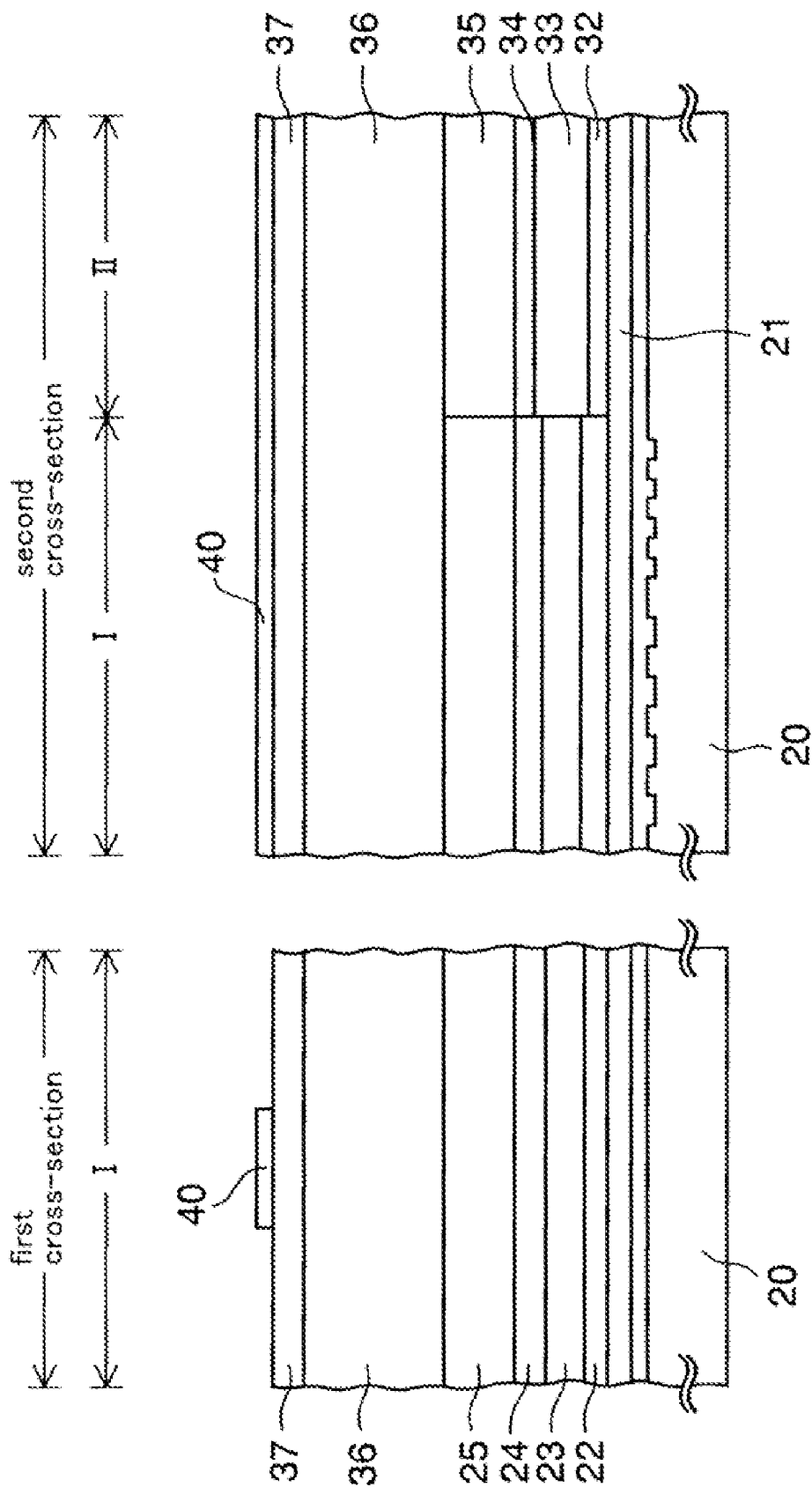

OPTICAL SEMICONDUCTOR DEVICE AND METHOD FOR MANUFACTURING THE SAME

CROSS-REFERENCE TO RELATED APPLICATIONS

This application is a continuation of International Patent Application No. PCT/JP2006/302975, filed Feb. 20, 2006, the entire contents of which are incorporated herein by reference.

TECHNICAL FIELD

It is related to an optical semiconductor device and a method for manufacturing the same.

BACKGROUND

Optical communications networks using optical fibers have been continuously expanding recently. Accordingly, low-cost semiconductor lasers with excellent high-temperature characteristics are being desired as light sources used for the optical communications.

Conventionally, an InGaAsP-based multiple quantum well structure, that is, a multiple quantum well structure in which an InGaAsP layer is formed as a barrier layer, has been used as an active layer of a semiconductor laser with a wavelength of 1.3 μm band or 1.55 μm band.

Recently, in contrast, an AlGaInAs-based multiple quantum well structure, that is, a multiple quantum well structure in which an AlGaInAs layer is formed as a barrier layer, has been drawing attention. The AlGaInAs-based multiple quantum well structure has a deeper band offset ΔEc in a conduction band and a shallower band offset ΔEv in a valence band than an InGaAsP-based multiple quantum well structure.

JP-A 8-125263 discloses a semiconductor laser employing such an AlGaInAs-based multiple quantum well structure as an active layer.

FIG. 1 is an energy band diagram of an optical semiconductor device disclosed in JP-A 8-125263.

In this optical semiconductor device, a lower cladding layer 2 formed of n-type InP, a lower optical guide layer 3 formed of InGaAsP, an active layer 4 having an AlGaInAs-based multiple quantum well structure, an upper optical guide layer 5 formed of InGaAsP, and an upper cladding layer 6 formed of p-type InP are formed on an n-type InP substrate.

Of these layers, the active layer 4 is formed by alternately stacking a quantum well layer 4a formed of InGaAsP and a barrier layer 4b formed of AlGaInAs.

As shown in FIG. 1, in the AlGaInAs-based multiple quantum well structure, as described above, the band offset ΔEc in the valence band is deep and the band offset ΔEv in the conduction band is shallow.

Since the band offset ΔEc in the valence band is deep in this manner, electrons E injected into the active layer 4 from an n-side (lower cladding layer 2 side) are effectively trapped in the quantum well layer 4a. As a result, the electrons E are prevented from overflowing from the quantum well layer 4a even under a high-temperature environment. In addition, since the band offset ΔEv in the conduction band is shallow, holes H injected into the active layer 4 from a p-side (upper cladding layer 6 side) are uniformly distributed into all the quantum well layers 4a, so that lasing efficiency in the entire active layer 4 can be increased. This prevents a deterioration in the efficiency of laser under a high-temperature environment without using a cooling element like a Peltier element.

Thus, costs for semiconductor lasers can be reduced by the cost of unnecessary cooling element.

JP-A 11-506273 also discloses one example of a semiconductor laser using, as an active layer, an AlGaInAs-based multiple quantum well structure as described above.

In an optical semiconductor device disclosed in JP-A 11-506273, both the lower optical guide layer 3 and the upper optical guide layer 5 in the structure of JP-A 8-125263 shown in FIG. 1 are formed of AlGaInAs.

FIG. 2 is an energy band diagram of the optical semiconductor device of JP-A 11-506273. In JP-A 11-506273, an AlGaInAs layer with a composition wavelength of 1.25 μm and a thickness of 70 nm is formed as each of optical guide layers 3 and 5. In addition, an InGaAs layer with a compressive strain of 0.6% and a thickness of 4.5 nm is used as a well layer 4a of an active layer 4. An AlGaInAs layer with no strain, a composition wavelength of 1.25 μm and a thickness of 13 nm is used as a barrier layer 4b.

As shown in FIG. 2, when the AlGaInAs layer is formed as the upper optical guide layer 5 in this manner, a potential barrier ΔE in the valence band of an upper InP cladding layer 6 and the upper optical guide layer 5 becomes large. For example, if the composition wavelength of the upper optical guide layer 5 is set to 1.25 μm, the potential barrier ΔE takes a value as large as approximately 280 meV. If the potential barrier ΔE is large like this, a deep potential spike V as shown by the dotted line is generated when a forward voltage is applied. This potential spike prevents holes H from being injected from the upper cladding layer 6 to the active layer 4, thus causing a problem of deteriorating the lasing efficiency.

In addition, JP-A 8-172241 also discloses a technique relating to the present application.

SUMMARY

It is an aspect of the embodiment discussed herein to provide an optical semiconductor device having a first optical semiconductor element, the first optical semiconductor element including a substrate, a lower cladding layer formed on the substrate, a lower optical guide layer which is formed on the lower cladding layer and is composed of AlGaInAs, an active layer which is formed on the lower optical guide layer and has a multiple quantum well structure where a barrier layer that is formed of AlGaInAs and a well layer are alternately stacked, an upper optical guide layer which is formed on the active layer and is composed of InGaAsP, and an upper cladding layer formed on the upper optical guide layer.

BRIEF DESCRIPTION OF THE DRAWINGS

FIGS. 3A to 3C are process cross-sectional views for describing the experiment carried out by the inventor of the present application;

FIGS. 4A to 4I are cross-sectional views showing processes of manufacturing an optical semiconductor device according to a first embodiment;

DETAILED DESCRIPTION OF THE EMBODIMENTS (1) Description of Experimental Results Prior to describing embodiments, the experiment that the inventor of the present application carried out will be described.

In an optical semiconductor device, there is a case where different types of optical semiconductor elements, for example a laser and a semiconductor optical modulator, are formed on a common substrate. In order to optimize each of the elements separately, it is desired that one optical semiconductor element be grown in a butt-joint manner to the other optical semiconductor element.

The inventor of the present application carried out an experiment to examine what kind of inconvenience would occur if an optical semiconductor element is grown in the butt-joint manner to the semiconductor laser that has a stacked structure of AlGaInAs-based multiple quantum well structure and an optical guide layer formed of InGaAsP.

Figure 3A:
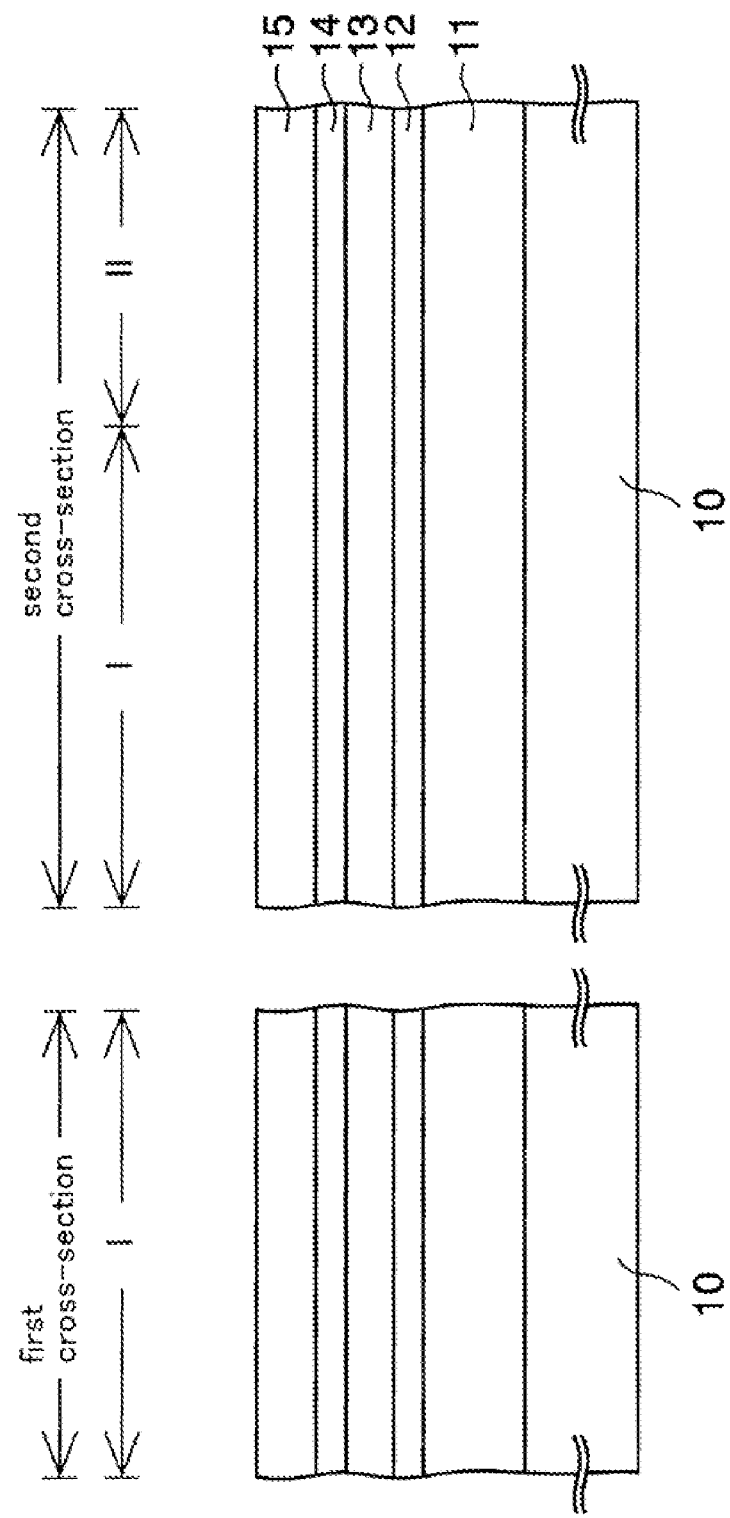
Figure 3B:
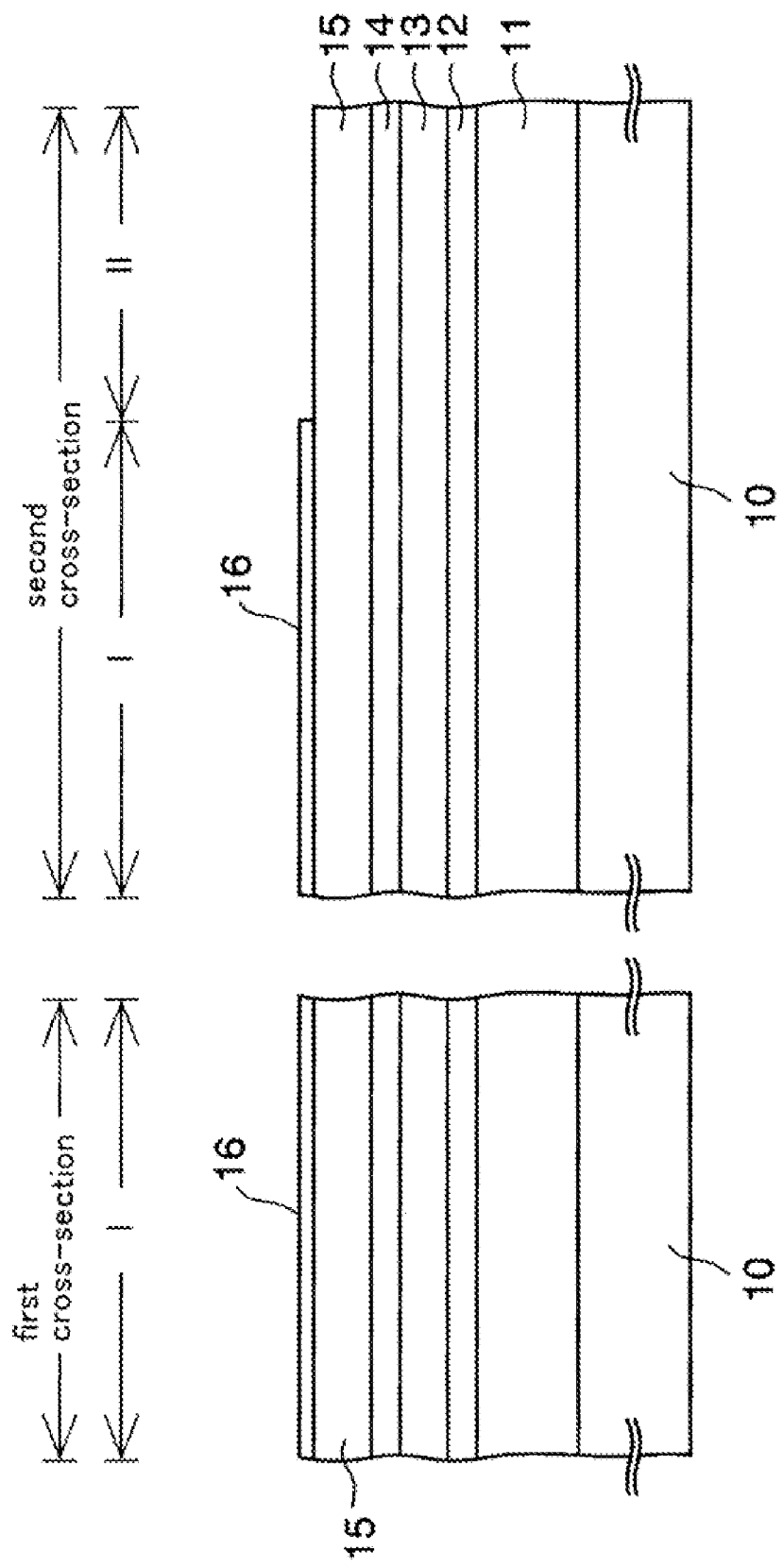

FIGS. 3A to 3C are cross-sectional views for illustrating processes of the experiment.

The experiment was made in attempt to form a semiconductor laser in a first region I of a substrate, and to form an optical semiconductor device different in type from the semiconductor laser in a second region II thereof by the above-described butt-joint growth.

Note that in FIGS. 3A to 3C, a first cross-section is a cross-section perpendicular to the direction of a resonator of the semiconductor laser to be formed in the first region I and a second cross-section is a cross-section in the direction of the resonator.

First, processes for obtaining a cross-sectional structure shown in FIG. 3A will be described.

Firstly, on an n-type InP substrate 10, a lower cladding layer 11 formed of n-type InP, a lower optical guide layer 12 formed of InGaAsP, an active layer 13 having an AlGaInAs-based multiple quantum well structure, an upper optical guide layer 14 formed of InGaAsP, and an upper cladding layer 15 formed of p-type InP are formed in this order by a MOCVD (Metal Organic Chemical Vapor Deposition) method.

Subsequently, as shown in FIG. 3B, a silicon oxide layer is formed on the entire surface of the upper cladding layer 15 by, for example, a thermal CVD method. Thereafter, the silicon oxide layer is patterned by photolithography or the like so as to be left only in the first region I as a mask layer 16.

Here, the above-described respective layers 11 to 15 are to configure the semiconductor laser to be formed in the first region I, and are unnecessary layers for another optical semiconductor element to be formed in the second region II, for example, an optical modulator.

Accordingly, in the next process, as shown in FIG. 3C, the layers from the upper cladding layer 15 to the lower cladding layer 12 in the second region II are wet-etched by using the mask layer 16 as a mask.

The wet-etching is carried out by the following two etching steps.

At the first etching step, hydrochloric acid is used as an etchant to etch the upper cladding layer 15 formed of p-type InP. Since the etching speed of the upper optical guide layer 14 formed of InGaAsP with hydrochloric acid is slower than that of the upper cladding layer 15, only the upper cladding layer 15 is substantially etched in the first etching step and the upper optical guide layer 14 serves as a stopper of the etching.

In the next second etching step, the layers from the upper optical guide layer 15 to the lower optical guide layer 12 are etched by using the mixed solution of sulfuric acid, hydrogen peroxide water, and water as an etchant.

Note that each of the side surfaces of the etched layers becomes a surface inclined from the perpendicular direction as shown in the dotted-line circle.

Here, with respect to the mixed solution of sulfuric acid, oxygenated water, and water, the etching speed of the AlGaInAs-based active layer 13 is faster when compared with that of the lower optical guide layer 12 formed of InGaAsP formed thereunder. For this reason, as shown in the figure, the side surface of the active layer 13 receded greatly before the lower optical guide layer 12 in the second region II was removed by etching.

However, if an amount of recession d is large, a void is generated in a layer to be regrown later in the second region II due to a space S generated by the recession of the active layer 13. Thereby, the respective elements of the first and second regions I and II are not optically coupled.

To avoid such an inconvenience, it can be considered that the lower optical guide layer 12 in the second region II is not etched forcedly, and that the etching is stopped at the time when the etching of the active layer 13 is finished. According to this, the side surface of the active layer 13 can be prevented from receding.

However, by doing so, in the second region II, the multiple quantum well structure of the active layer is caused to be directly regrown from the surface of the lower optical guide layer 12 which was left without being etched. This causes another problem of deterioration in crystallinity of the active layer, and deterioration in oscillation characteristics due to increase of non-radiative recombination.

For this reason, in this type of optical semiconductor device, the lower optical guide layer 12 in the second region II is removed by etching, while the amount of recession d of the active layer 13 is kept as small as possible. After that, regrowth is started on the lower InP cladding layer, and then an active layer multiple quantum well structure is stacked, following the growth of the lower optical guide layer. By such a process, it is desirable that crystallinity of the multiple quantum well structure be not deteriorated as much as possible.

In light of the foregoing description, the inventor of the present application came up with embodiments as described below.

(2) First Embodiment

FIGS. 4A to 4I are cross-sectional views showing processes of manufacturing an optical semiconductor device according to a first embodiment.

Firstly, processes for obtaining a cross-sectional structure shown in FIG. 4A will be described.

A diffraction grating 20a is formed, by an electron beam lithography, only in a first region I of an n-type InP (semiconductor) substrate 20 having the first and a second regions I and II adjacent to each other. In the present embodiment, a depth of the diffraction grating 20a is set to 25 nm. In addition, a λ/4 shift 20b is formed in the center of the first region I.

Subsequently, a diffraction grating buried layer formed of n-type InGaAsP with a composition wavelength of 1.15 μm, a lower cladding layer 21 formed of n-type InP, a lower optical guide layer 22 formed of AlGaInAs with a composition wavelength of 1.2 μm, an active layer 23 having an AlGaInAs-based multiple quantum well structure, an upper optical guide layer 24 formed of InGaAsP with a composition wavelength of 1.05 μm, and an upper cladding layer 25 formed of p-type InP, are formed in this order by the MOCVD method.

In the growth by the MOCVD method, TEG (Triethyl Gallium), TMI (Trimethyl Indium), TMA (Trimethyl Aluminum) are respectively used as material gases of group-III Ga, In, and Al. In addition, $AsH_3$ and $PH_3$ are respectively used as material gases of group-V As and P.

Thicknesses of these layers can be variously set depending on a design. For example, the diffraction grating buried layer is formed with a thickness of 70 nm, the lower cladding layer 21 is formed with a thickness of 60 nm, the lower optical guide layer 22 and the upper optical guide layer 24 are formed with a thickness of 50 nm, and the upper cladding layer 25 is formed with a thickness of 150 nm, respectively.

Of these layers, the optical guide layers 22 and 24 have a narrower band gap than the cladding layers 21 and 25, and thus have a higher refraction index than these cladding layers 21 and 25. For this reason, a region having a high refraction index increases on and under the active layer 23, whereby it becomes easy to trap a laser beam in the respective layers 22 to 24. The optical guide layers 22 and 24 having such a function are also referred to as SCH (Separate Confinement Heterostructure) layers.

In addition, in the present embodiment, as the active layer 23 having an AlGaInAs-based multiple quantum well structure which has a gain peak in a composition wavelength of around 1.55 μm, a stacked film in which multiple well layers 23a, each being formed of AlGaInAs with a thickness of 5 nm and a compressive strain of 1.5%, and multiple barrier layers 23b, each being formed of AlGaInAs with a thickness of nm, a tensile strain of 0.3% and a composition wavelength of 1.2 μm, are alternately stacked, is employed. The number of the stacked layers is not particularly limited. Six layers of the well layers 23a and seven layers of the barrier layers 23b are formed here.

Additionally, lengths of the first and second regions I and II are not particularly limited. However, it is preferable to set the length of the first region I to 300 μm and the length of the second region II to 250 μm.

Then, the optical semiconductor device according to the present embodiment is different from that in the example of FIG. 3A, in which the lower optical guide layer 12 is formed of InGaAsP, in that the lower optical guide layer 22 is formed of AlGaInAs.

Figure 4B:
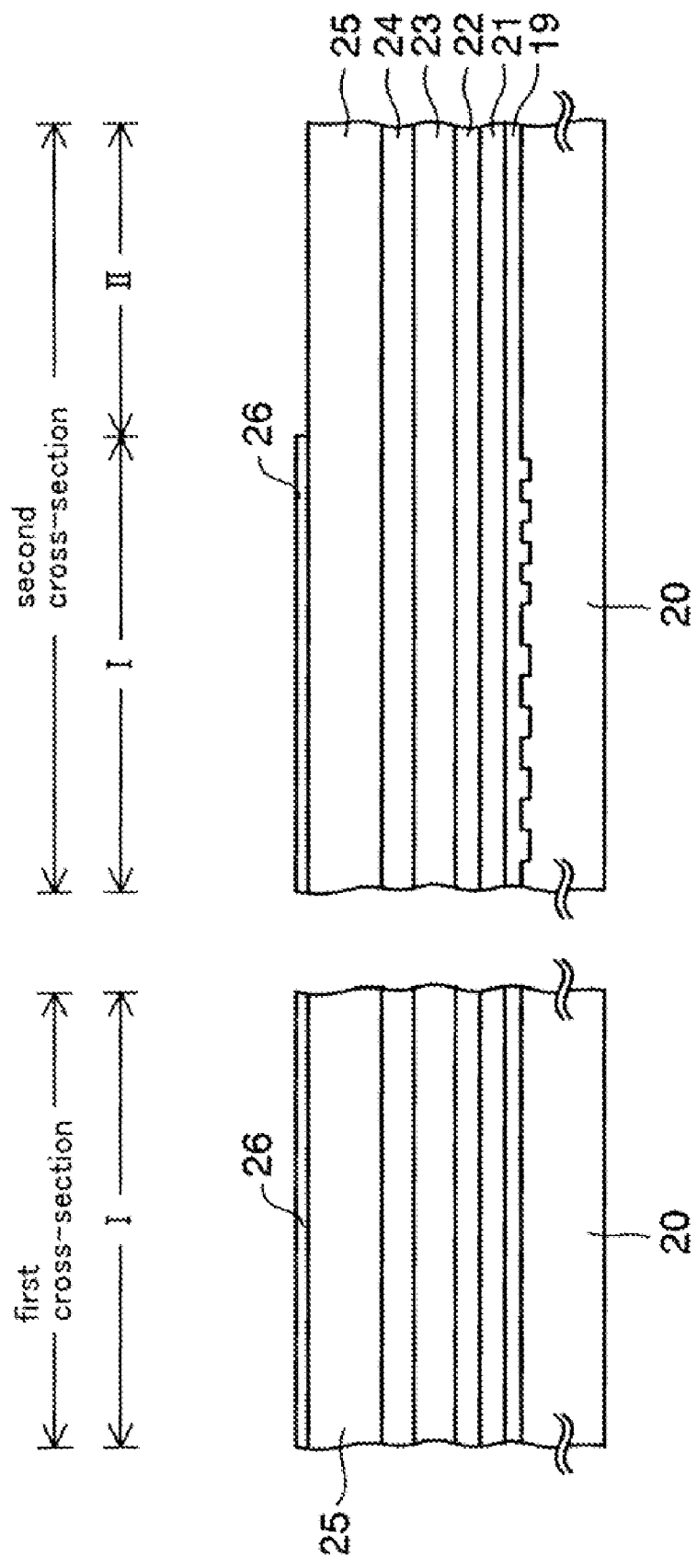

After that, as shown in FIG. 4B, a silicon oxide layer is formed on the entire surface of the upper cladding layer 25 by a thermal CVD method or the like. Thereafter, the silicon oxide layer is patterned by photolithography or the like so as to be left only in the first region I as a first mask layer 26.

Next, processes for obtaining a cross-sectional structure shown in FIG. 4C will be described.

The upper cladding layer 25 in the second region II which is not covered with the first mask layer 26 is selectively removed by wet etching using hydrochloric acid as a first etchant.

Here, the etching speed of the upper optical guide layer 24 formed of InGaAsP with respect to hydrochloric acid is lower than that of the upper cladding layer 25 formed of InP. Accordingly, in this etching, only the upper cladding layer 25 is substantially etched and the upper optical guide layer 24 formed thereunder functions as a stopper for the etching.

Subsequently, the upper optical guide layer 24, the active layer 23, and the lower optical guide layer 22 in the second region II which are not covered with the first mask layer 26 are removed by wet etching using the mixed solution of sulfuric acid, hydrogen peroxide water, and water as a second etchant.

Note that each of the side surfaces of the etched layers is inclined from the perpendicular direction as shown in the dotted-line circle.

As already mentioned, in the present embodiment, both the lower optical guide layer 22 and the active layer 23 are formed of AlGaInAs. Accordingly, in this etching, a difference in the etching speed between the lower optical guide layer 22 and the active layer 23 does not substantially occur. Thus, even after the etching of the lower optical guide layer 22 is finished, the side surface of the active layer 23 does not recede greatly, and the respective side surfaces of the active layer 23 and the lower optical guide layer 22 form substantially the same surface.

By the processes described so far, a DFB (Distributed Feedback) laser element, consisting of the InP substrate 20, the diffraction grating buried layer 19, the lower cladding layer 21, the lower optical guide layer 22, the active layer 23, the upper optical guide layer 24, and the upper cladding layer 25, is formed in the first region I as a first optical semiconductor element 51.

Figure 4D:
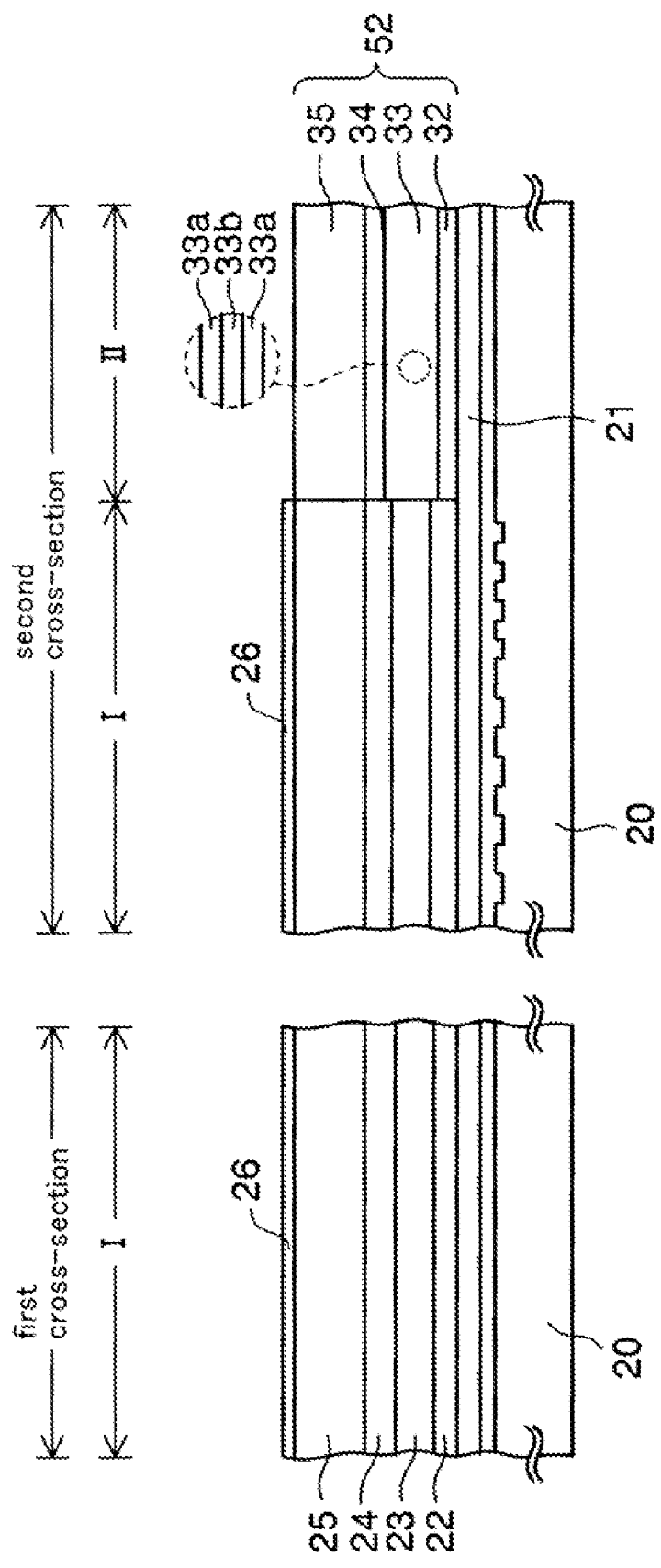

Subsequently, as shown in FIG. 4D, a modulator lower optical guide layer 32 formed of InGaAsP with a composition wavelength of 1.15 μm, a modulator active layer 33 having an InGaAs-based multiple quantum well structure, a modulator upper optical guide layer 34 formed of an InGaAsP graded layer with a composition wavelength varying continuously from 1.15 μm to 1.00 μm, and a modulator upper cladding layer 35 formed of p-type InP are formed in this order on the lower cladding layer 21 in the second region II by the MOCVD method.

Note that, by the MOCVD method, a layer is not grown on the first mask layer 26 formed of silicon oxide, and the above-described respective layers 32 to are epitaxially grown only on the lower cladding layer 21 which is exposed in the second region II.

In addition, film-thicknesses of these layers 32 to 35 are not particularly limited. In the present embodiment, the modulator lower optical guide layer 32 is formed with a thickness of 50 nm, the modulator upper optical guide layer 34 is formed with a thickness of 50 nm, and the modulator upper cladding layer 35 is formed with a thickness of 150 nm. Moreover, as the modulator active layer 33, a structure in which a barrier layer 33b formed of InGaAsP with a thickness of nm, a tensile strain of 0.3%, and a composition wavelength of 1.3 μm and a well layer 33a formed of InGaAsP with a thickness of 9 nm and a compressive strain of 0.5% are stacked can be employed, for example. The number of stack is not limited. For example, eight layers of the barrier layers 33b and seven layers of the well layers 33a are formed. The band gap wavelength of the modulator is not particularly limited. In the case where the oscillation wavelength of the laser element formed in the first region I as the first optical semiconductor element 51 is approximately 1.55 μm, the PL wavelength of the modulator may be set to approximately 1.49 μm to 1.50 μm.

The respective layers 32 to 35 formed in the second region II in this manner configure a second optical semiconductor element 52. In the present embodiment, the second optical semiconductor element 52 functions as an electroabsorption semiconductor optical modulator which modulates a laser beam oscillated from the first optical semiconductor element 51.

As described above, in the present embodiment, the amount of recession of the active layer 23 is greatly reduced in the etching process of FIG. 4C, when compared with the case of FIG. 3C. Thus, a void can be prevented from being generated in the modulator active layer 33 and the like due to the recession of the active layer 23. Thereby, the above-described respective layers 32 to 35 can be formed so as to be in good contact with the side surface of the first optical semiconductor element 51. As a result, the respective elements 51 and 52 can be optically well coupled to each other without causing loss of optical signals between the first optical semiconductor element 51 and the second optical semiconductor element.

Moreover, in the etching process of FIG. 4C, the lower optical guide layer 22 in the second region II is removed by etching so as to grow the modulator lower optical guide layer 32 on the surface of the lower cladding layer 21 in the present step. Thereby, the modulator lower optical guide layer 32 also functions as a buffer layer which does not transmit a lattice defect present on the surface of the lower cladding layer 21 to an upper layer. Thus, the lattice defect can be prevented from generating in the modulator active layer 33 formed on the modulator lower optical guide layer 32.

After this step is finished, the first mask layer formed of silicon oxide is removed by wet etching using buffered hydrofluoric acid solution as an etchant.

Next, as shown in FIG. 4E, a p-type InP layer with a thickness of approximately 1.5 μm is grown on each of the upper cladding layer 25 and the modulator upper cladding layer 35 by the MOCVD method. The resultant InP layer is set to an upper-side layer 36 of the upper cladding.

Furthermore, a p-type InGaAsP layer is formed, by the MOCVD method, with a thickness of approximately 300 nm on the upper-side layer 36 as a contact layer 37.

Next, as shown in FIG. 4F, a silicon oxide layer is formed on the contact layer 37 by the thermal CVD method or the like. Thereafter, the silicon oxide layer is patterned by photolithography to form a stripe-shaped second mask layer 40 which is longer in the direction of laser and the resonator of the modulator.

Figure 4G:
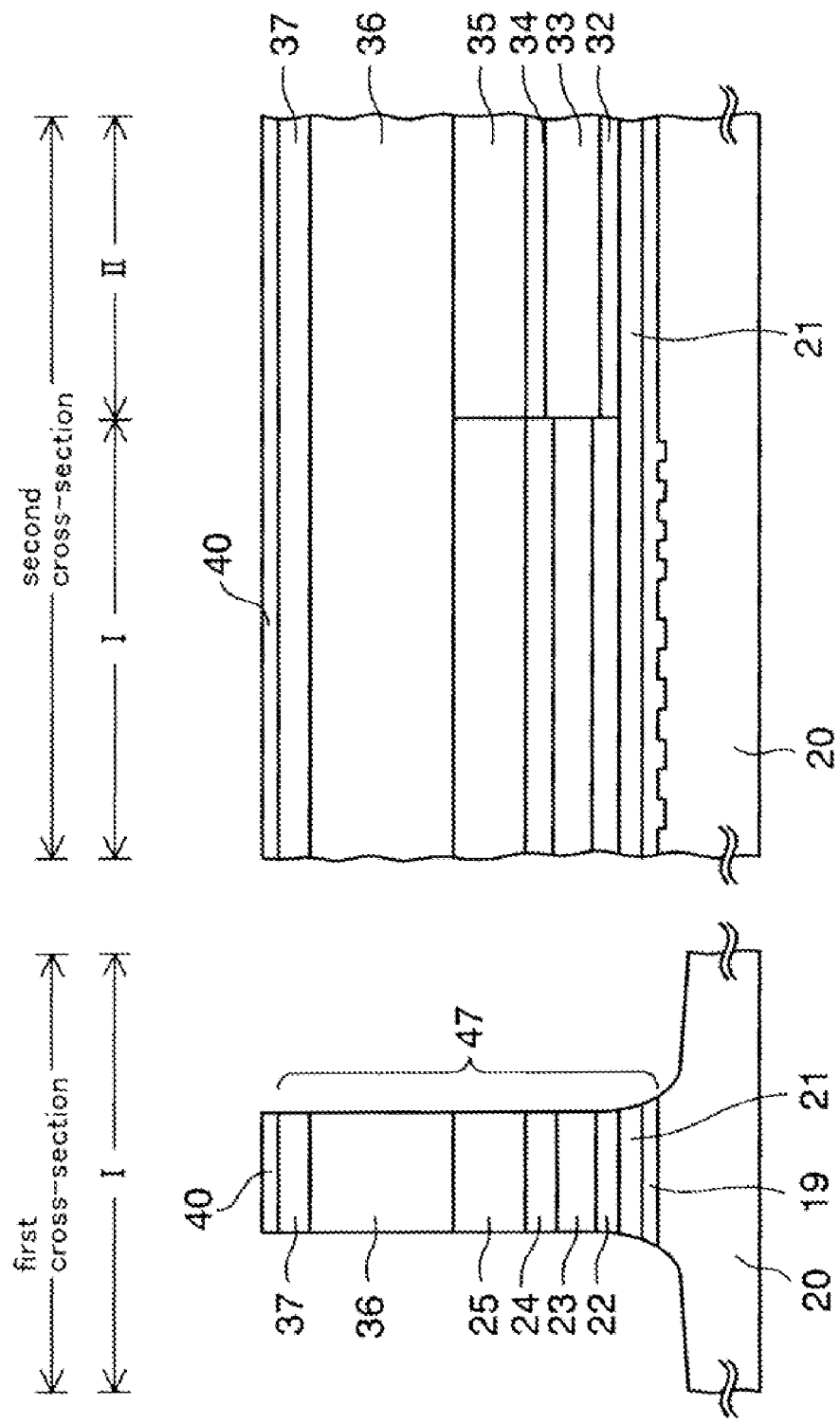

Next, as shown in FIG. 4G, by using the above-described second mask layer 40 as a mask, the portion from the contact layer 37 to the middle portion of the substrate 20 in the first and second regions I and II is etched to form a mesa stripe 47 extending in the direction of the resonator. The etching is carried out by, for example, ICP-RIE (Inductively Coupled Plasma Reactive Ion Etching) using a chlorine-based gas as an etching gas.

Figure 4H:
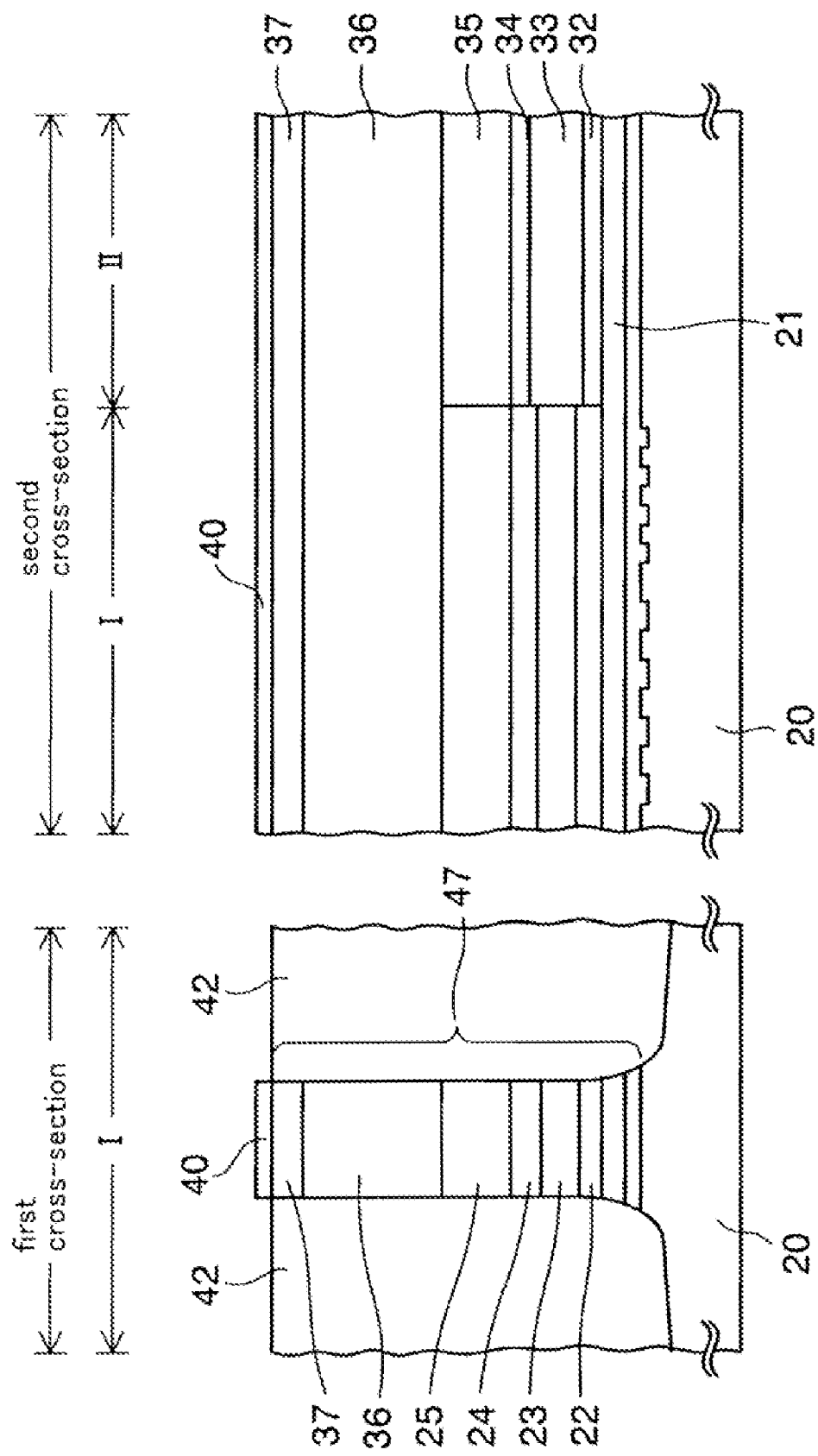

Next, as shown in FIG. 4H, an InP layer, which is a semi-insulating layer formed by Fe doping, is formed on both sides of the mesa stripe 47 by the MOCVD method as a buried layer 42. Note that the buried layer 42 is only grown on the side surfaces of the mesa stripe 47 and is not grown on the second mask layer 40 formed of silicon oxide.

Then, the second mask layer 40 is removed after the buried layer 42 is formed.

Next, processes for obtaining a cross-sectional structure shown in FIG. 4I will be described.

First, a silicon oxide layer as a protective layer 44 is formed, for example, by the thermal CVD method on each of the upper surfaces of the contact layer 37 and the buried layer 42.

After that, the protective layer 44 is patterned by photolithography to form an electrode window 44a in the protective layer 44 over the mesa stripe 47.

Furthermore, as first and second p-side electrodes 45a and 45b, a Ti layer, a Pt layer, and an Au layer are deposited in this order on the contact layer 37 which is exposed from the electrode window 44a. Note that, in the present embodiment, the electrodes 45a and 45b are formed at intervals of 50 μm so that the first and second regions I and II can be electrically separated from each other.

Thereafter, AuGe/Au is deposited as an n-side electrode 46 on the back surface of the InP substrate 20. Finally, the resultant substrate 20 is cleaved into arrays and the both end surfaces thereof are coated with a nonreflective film.

Thus, the basic structure of the optical semiconductor device according to the present embodiment is completed.

In this optical semiconductor device, a predetermined current or voltage is applied to each of the first and second p-side electrodes 45a and 45b separately. Thereby, the laser beam oscillated from the active layer 23 of the first optical semiconductor element 51 is modulated in the modulator active layer 33 of the second optical semiconductor element 52.

According to the above-described present embodiment, both the lower optical guide layer 22 and the active layer 23 are formed of AlGaInAs. Accordingly, in the etching step of FIG. 4C, there is no difference in the etching speed between these layers 22 and 23, and thus the side surface of the active layer 23 does not greatly recede even after the etching of the lower optical guide layer 22 is finished. For this reason, in the step of FIG. 4D, the void due to the recession of the active layer 23 can be prevented from being generated in the modulator active layer 33 when the modulator active layer 33 and the like are grown in the second region II. Thereby, the first optical semiconductor element 51 and the second optical semiconductor element 52 can be optically well coupled to each other. Thus, a quality of the optical semiconductor device, which is formed by integrating the different types of elements 51 and 52 on one substrate 50, can be increased.

Figure 5:
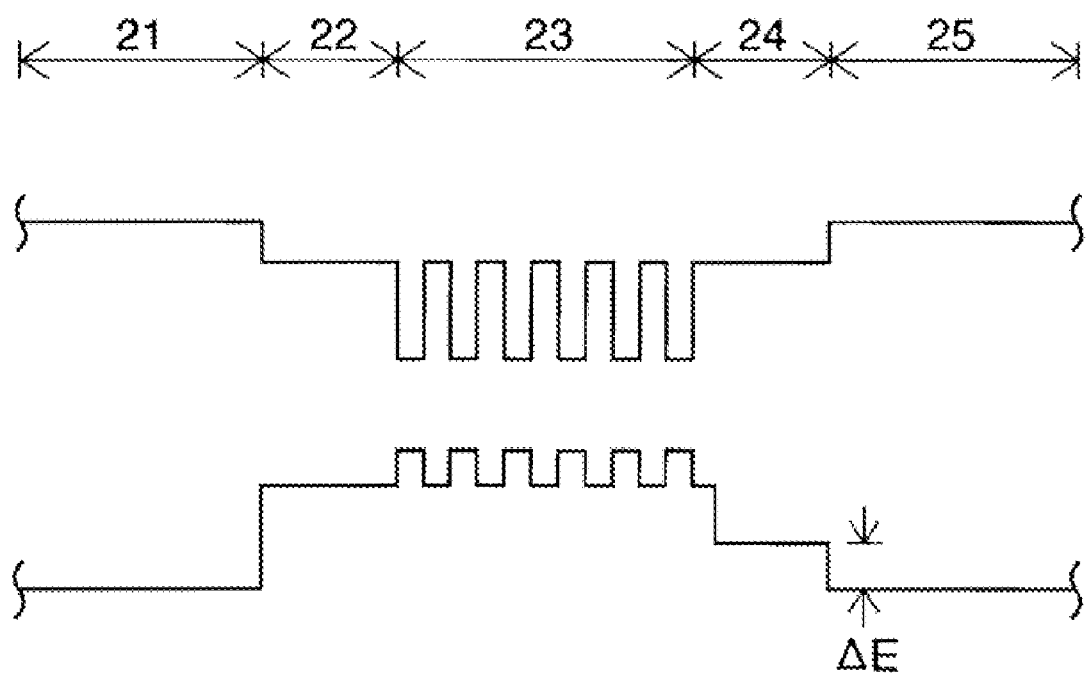
FIG. 5 is an energy band diagram of a first optical semiconductor element provided to the optical semiconductor device according to the first embodiment.

FIG. 5 is an energy band diagram of the first optical semiconductor element 51.

Figure 1:
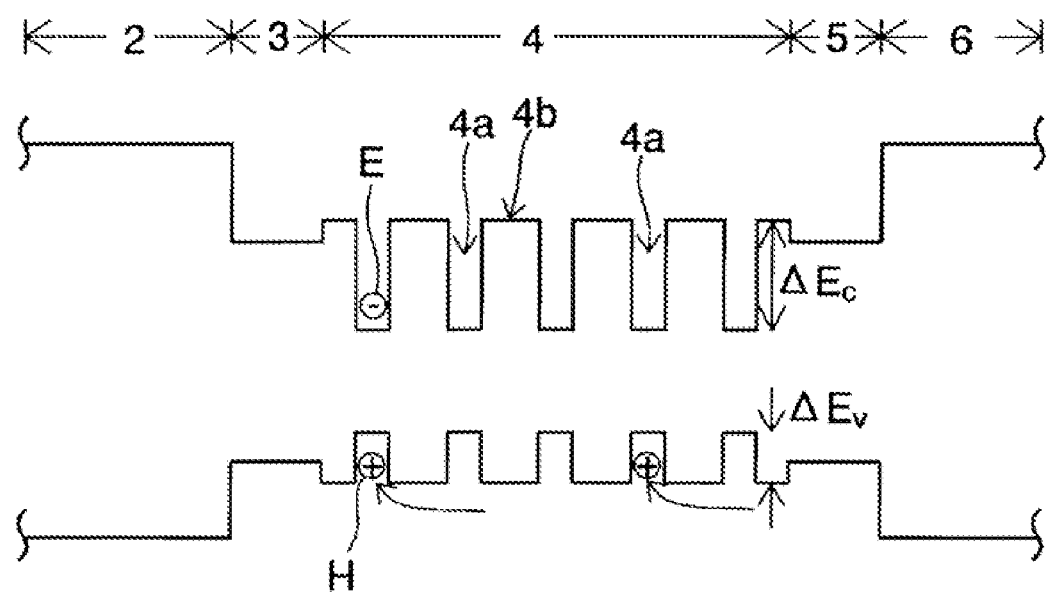
FIG. 1 is an energy band diagram of an optical semiconductor device disclosed in patent JP-A 8-125263.
Figure 2:
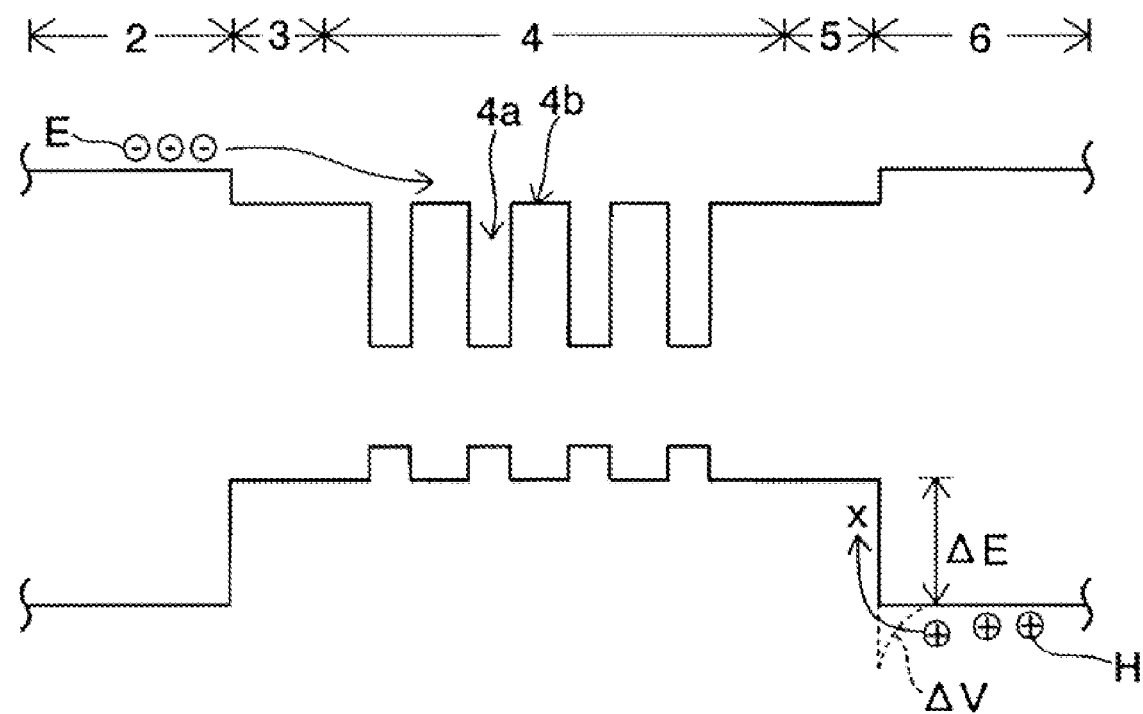
FIG. 2 is an energy band diagram of an optical semiconductor device disclosed in patent JP-A 11-506273.

In the present embodiment, the upper optical guide layer 24 is formed of InGaAsP. Thus, a potential barrier ΔE in the valence band side between the upper optical guide layer 24 and the upper cladding layer 25 becomes smaller than that disclosed in JP-A 11-506273 (see, FIG. 2) in which the upper optical guide layer is formed of AlGaInAs. For this reason, the potential spike V of the valence band shown in FIG. 2 can be eliminated. Thereby, holes can be effectively injected from the upper cladding layer 25 to the active layer 23 without being disturbed by the potential spike. Thus, lasing efficiency in the active layer 23 can be increased.

Figure 6:
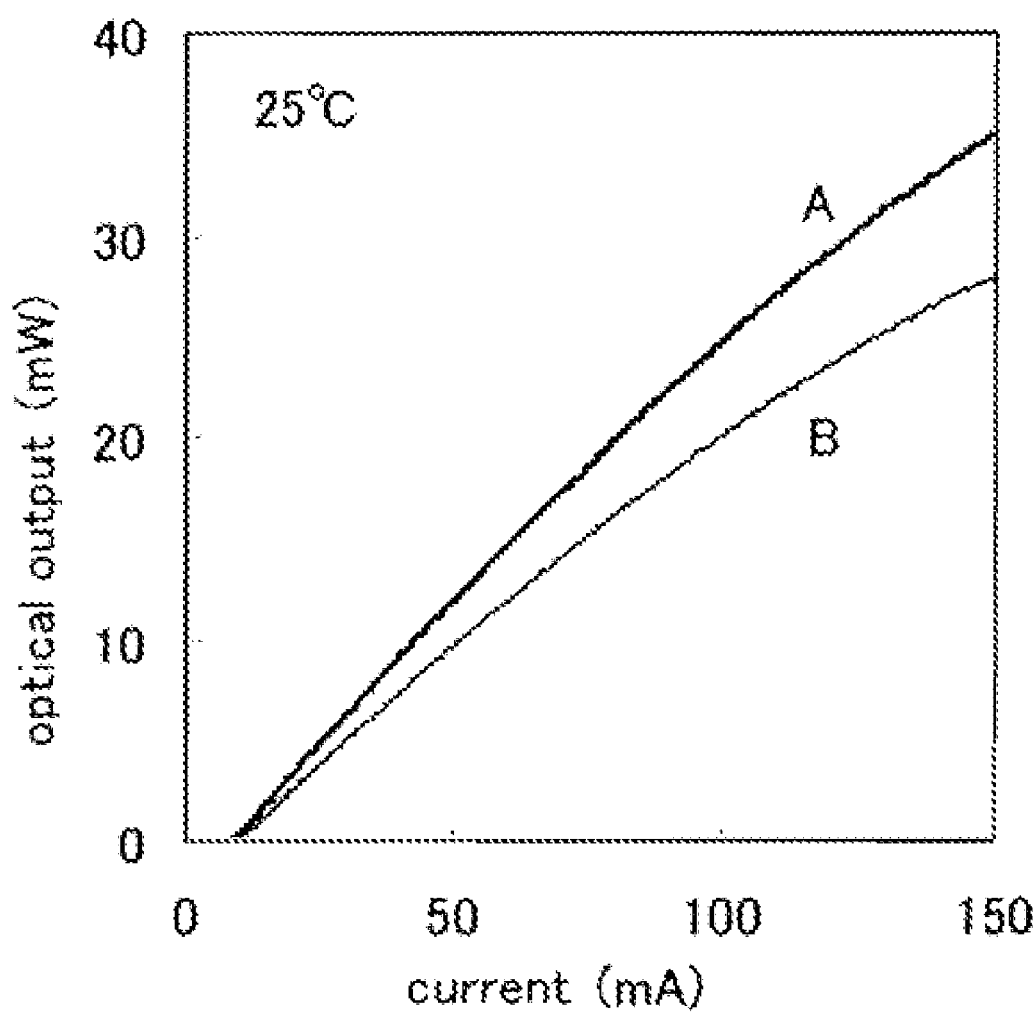
FIG. 6 is a graph showing each of current-optical output characteristics of a laser element A, in which a p-type InGaAsP layer is formed as an upper optical guide layer, and a laser element B, in which a p-type AlGaInAs layer is formed as an upper optical guide layer.

FIG. 6 is a graph showing each of current-optical output characteristics of a laser element A in which an InGaAsP layer is formed as an upper optical guide layer like the present embodiment and a laser element B according to a comparative example in which an AlGaInAs layer is formed as an upper optical guide layer like JP-A 11-506273. Note that the current-optical output characteristics are characteristics at a temperature of 25° C.

The laser element A is 1.55 μm-band AlGaInAs-based laser and has a stacked structure in which an InGaAsP layer with a thickness of 30 nm and a composition wavelength of 1.1 μm and an InGaAsP layer with a thickness of 70 nm and a composition wavelength of 1.0 μm are stacked in two levels as the upper optical guide layer.

On the other hand, in the laser element B, the thickness of the AlGaInAs upper optical guide layer was set to 50 nm and the composition wavelength thereof was set to 1.1 μm. Note that the multiple quantum well structures of the active layers of the laser elements A and B are the same. Furthermore, both of the laser elements are both-ends-cleaved Fabry-perot lasers, each of which has a resonator length of 300 μm and does not have a diffraction grating layer.

As shown in FIG. 6, in the laser element A in which the InGaAsP layer is formed as the upper optical guide layer, the threshold current is 9.2 mA. On the other hand, in the laser element B in which the AlGaInAs layer is formed as the upper optical guide layer, the threshold current is 10.8 mA. Accordingly, in the laser element A having the structure similar to that of the present embodiment, the threshold current can be reduced by approximately 15% when compared with that of the laser element B.

In addition, with regard to the optical output, at 100 mA for example, the optical output of the laser element A is 24.8 mW and the optical output of the laser element B is 20.1 mW. Accordingly, the optical output of the laser element A is increased by approximately 23%, when compared with that of the laser element B.

The reason why the threshold current is decreased and the optical output is increased in the laser element A as described above is that the above-described potential spike was eliminated by forming the InGaAsP layer as the upper optical guide layer.

Note that the present invention is not limited to the above-described structure.

In the present embodiment, a modulator in which a multiple quantum well structure of the active layer is formed of an InGaAsP-based material, is employed as a modulator for butt-joint growth in the second region II. However, the modulator active layer 33 may also be formed of an AlGaInAs-based multiple quantum well.

In this case, for example, an InGaAsP layer with a composition wavelength of 1.05 μm is formed as the modulator lower optical guide layer 32. Then, as the modulator active layer 33, the well layer 33a and the barrier layer 33b are formed, where the well layer 33a is formed of AlGaInAs with a thickness of 9 nm and a compressive strain of 0.5%, and the barrier layer 33b is formed of AlGaInAs with a thickness of 5 nm, a composition wavelength of 1.34 μm, and tensile strain of 0.3%. Moreover, as the modulator upper optical guide layer 34, an InGaAsP graded layer with a composition wavelength varying continuously from 1.32 μm to 1.00 μm is formed. Then, as the modulator upper cladding layer 35, a p-type InP layer with a thickness of 150 nm is formed.

In addition, the PL wavelength of the modulator in this case is not particularly limited. In the case where the oscillation wavelength of the laser element formed in the first region I as the first optical semiconductor element 51 is approximately 1.55 μm, the PL wavelength of the modulator may be set to approximately 1.49 μm to 1.50 μm.

(2) Second Embodiment

In the above-described first embodiment, the composition of InGaAsP constituting the upper optical guide layer 24 on the side of the semiconductor laser formed in the first region is kept constant.

In contrast, in the present embodiment, the composition of InGaAsP is caused to be continuously changed to employ a so-called graded layer as an upper optical guide layer 24. The configuration other than this is the same as that of the first embodiment, and the cross-sectional structure of an optical semiconductor device according to the present embodiment is also the same as that of FIG. 4I.

Figure 7:
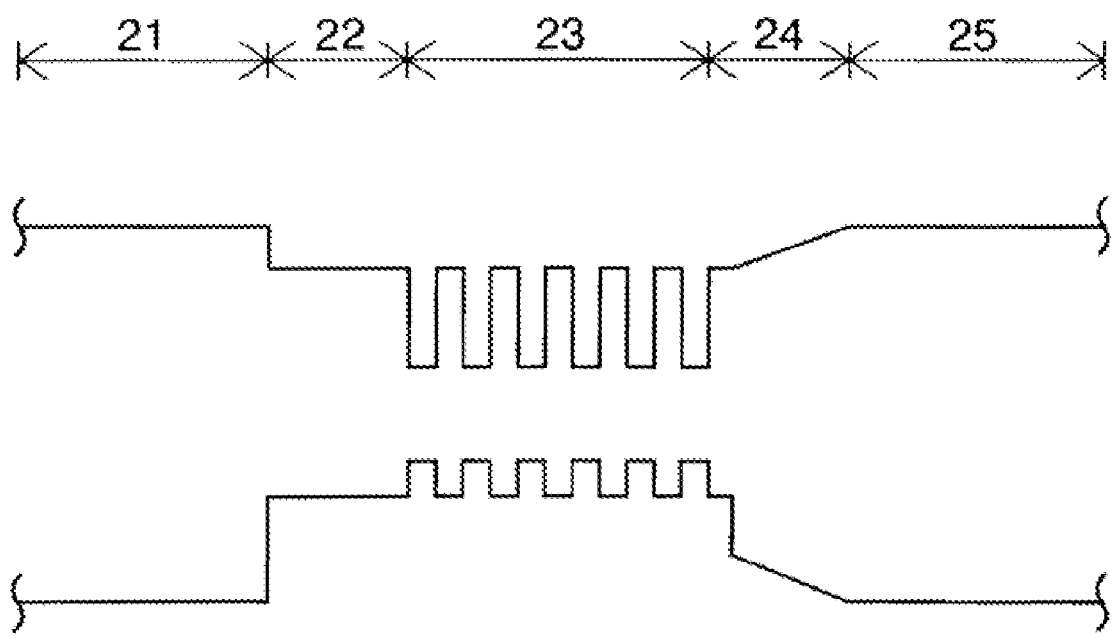
FIG. 7 is an energy band diagram of an optical semiconductor device according to a second embodiment.

FIG. 7 is an energy band diagram of the optical semiconductor device according to the present embodiment.

As shown in FIG. 7, in the upper optical guide layer 24, the composition of InGaAsP is caused to be continuously changed so that the band gap becomes narrower from an upper cladding layer 25 to an active layer 23.

Such a graded layer may be formed by, for example, continuously changing a flow rate of reactant gas for InGaAsP when the upper cladding layer 25 is formed by the MOCVD method.

By employing the above-described graded layer as the upper cladding layer 25, the above-described potential barrier of valence band becomes easier to be eliminated. Thereby, lasing efficiency in the active layer 23 can be further increased than that of the first embodiment.

(3) Third Embodiment

Figure 8:
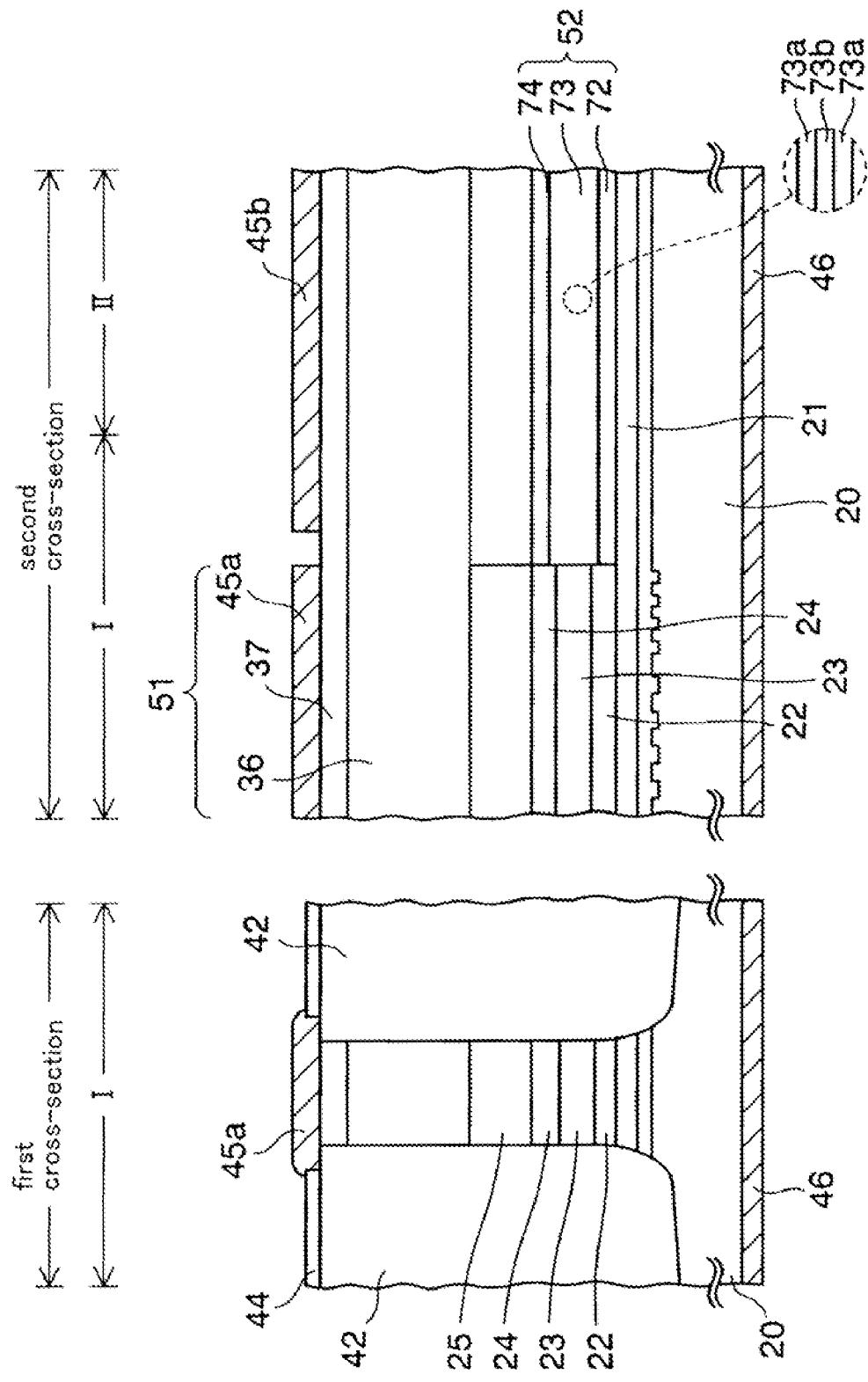
FIG. 8 is a cross-sectional view of an optical semiconductor device according to a third embodiment.

FIG. 8 is a cross-sectional view of an optical semiconductor device according to the present embodiment.

Figure 4I:
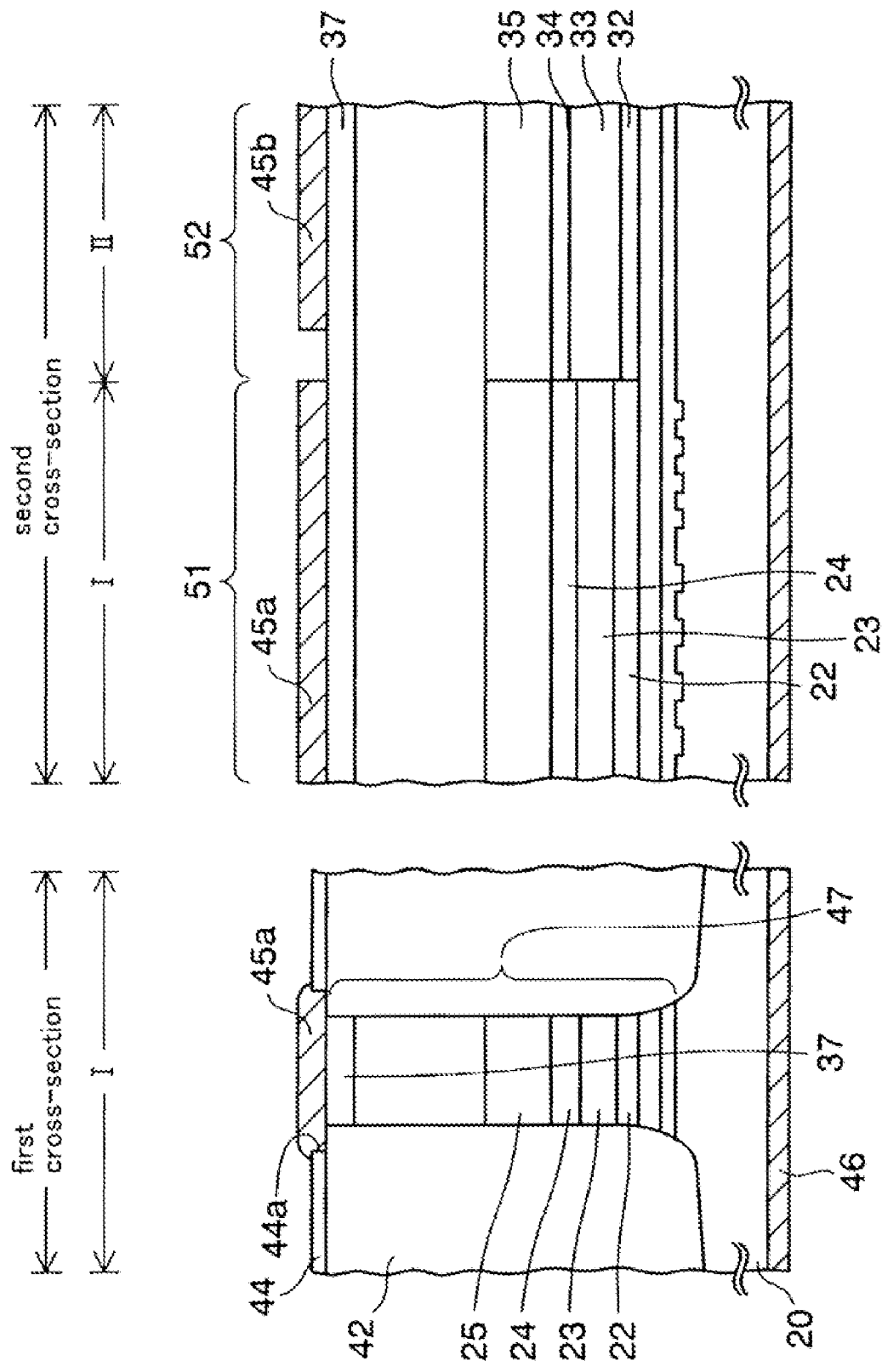

In the above-described first and second embodiments, as shown in FIG. 4I, an electroabsorption semiconductor optical modulator is formed as the second optical semiconductor element 52.

On the other hand, in the present embodiment, a semiconductor optical amplifier is formed as a second optical semiconductor element 52.

As shown in FIG. 8, the second optical semiconductor element 52 functioning as an optical semiconductor amplifier is obtained by forming, on the lower cladding layer 21, an amplifier lower optical guide layer 72, an amplifier active layer 73, an amplifier upper optical guide layer 74, and an amplifier upper cladding layer 75 in this order by the MOCVD method. The configuration other than this is the same as that of the first embodiment.

Note that these layers 72 to 75 are formed in place of the layers 32 to 35 described in the first embodiment and can be formed by using the method for forming the layers 32 to 35. Accordingly, the method for manufacturing the semiconductor device according to the present embodiment will be omitted.

Film-thicknesses and materials for the above-described layers 72 to 75 are not particularly limited. In the present embodiment, an InGaAsP layer with a composition wavelength of 1.15 μm and a thickness of 50 nm is formed as the lower optical guide layer 72. In addition, as the amplifier active layer 73, a multiple quantum well structure having a gain in 1.55 μm band is employed. The multiple quantum well structure is formed by stacking a barrier layer 73b and a well layer 73a. The barrier layer 73b is formed of InGaAsP with a composition wavelength of 1.3 μm, a thickness of 10 nm, and with no strain. The well layer 73a is formed of InGaAsP with a thickness of 5 nm and a compression strain of 0.8%. The numbers of stack of the barrier layer 73b and the well layer 73a are, for example, seven and six, respectively.

Furthermore, as the upper optical guide layer 74, an InGaAsP layer with a composition wavelength of 1.15 μm and a thickness of 50 nm is formed. Then, as the amplifier upper cladding layer 75, a p-type InP layer with a thickness of 150 nm is formed. The length of the semiconductor optical amplifier is not particularly limited. It is preferable to set the length of a second region II to 650 μm and the length of a second electrode 45b to 600 μm, for example.

The second optical semiconductor element 52 formed in this manner functions to amplify the laser beam oscillated from the first optical semiconductor element by applying a predetermined current between the second p-side electrode 45b and an n-side electrode 46.

As described in the first embodiment, the side surface of an active layer 23 does not recede greatly in the step of removing the active layer 23 and a lower optical guide layer 22 in the second region II by wet etching. Thus, a void is not generated in the amplifier active layer 73 when the amplifier active layer 73 and the like are grown in the second region II. Accordingly, the second optical semiconductor element 52 can be formed so as to be in good contact with the side surface of the first optical semiconductor element 51. Thereby, the laser beam oscillated from the first optical semiconductor element 51 can be effectively amplified by the second optical semiconductor element 52.

(4) Fourth Embodiment

Figure 9:
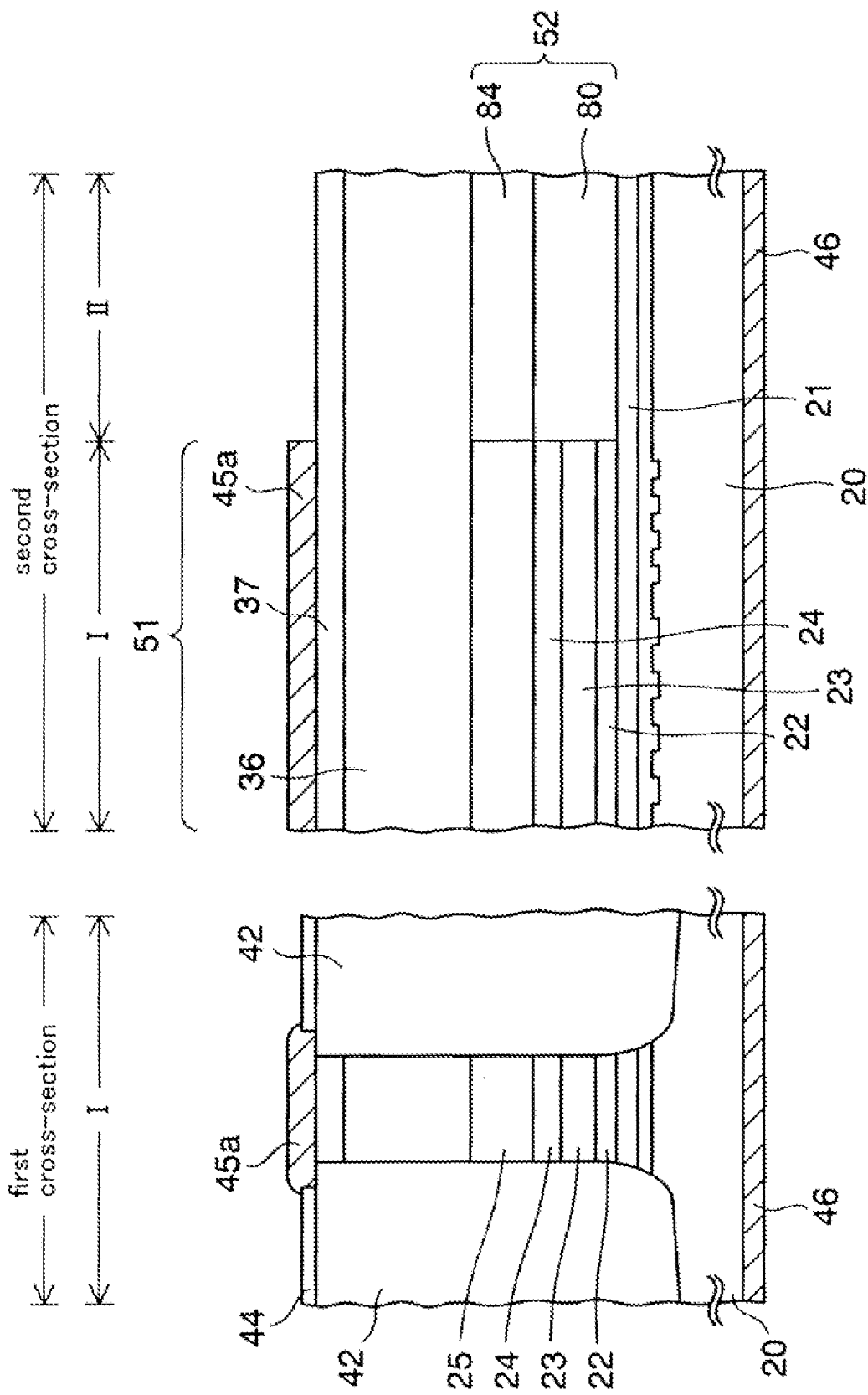
FIG. 9 is a cross-sectional view of an optical semiconductor device according to a fourth embodiment.

FIG. 9 is a cross-sectional view of an optical semiconductor device according to the present embodiment.

In the present embodiment, an optical waveguide is formed as a second optical semiconductor element 52. The configuration other than this is the same as that of the first embodiment.

As shown in FIG. 9, the second optical semiconductor element 52 functioning as an optical waveguide is obtained by forming a core layer 80 and an optical waveguide upper cladding layer 84 in this order on the lower cladding layer 21 by the MOCVD method.

Materials for the layers 80 and 84 are not particularly limited. In the present embodiment, an InGaAsP layer with a composition wavelength of 1.33 µm and a thickness of 200 nm is formed as the core layer 80. In addition, a p-type InP layer with a thickness of 150 nm is formed as the optical waveguide upper cladding layer 84. The materials and thicknesses of the core layer 80 and the cladding layer 84 are not limited to these. The compositions and thicknesses may be adjusted so that the equivalent refractive index of the optical waveguide would agree with that of the waveguide in a laser element in a first region I.

Although the length of the optical waveguide is not particularly limited, it may be set to 250 µm for example.

Note that these layers 80 and 84 are formed in place of the layers 32 to 35 described in the first embodiment and can be formed by using the method for forming the layers 32 to 35. Accordingly, a method for manufacturing the semiconductor device according to the present embodiment will be omitted.

In the present embodiment, similar to the first embodiment, the amount of recession of the side surface of an active layer 23 is reduced. Accordingly, a void becomes difficult to be formed in the core layer 80 when the core layer 80 is grown in a second region II. Thereby, the core layer 80 can be formed so as to be in contact with the active layer 23. Thus, the laser beam oscillated from a first optical semiconductor element 51 can be effectively guided to the subsequent stage.

(5) Fifth Embodiment

Figure 10:
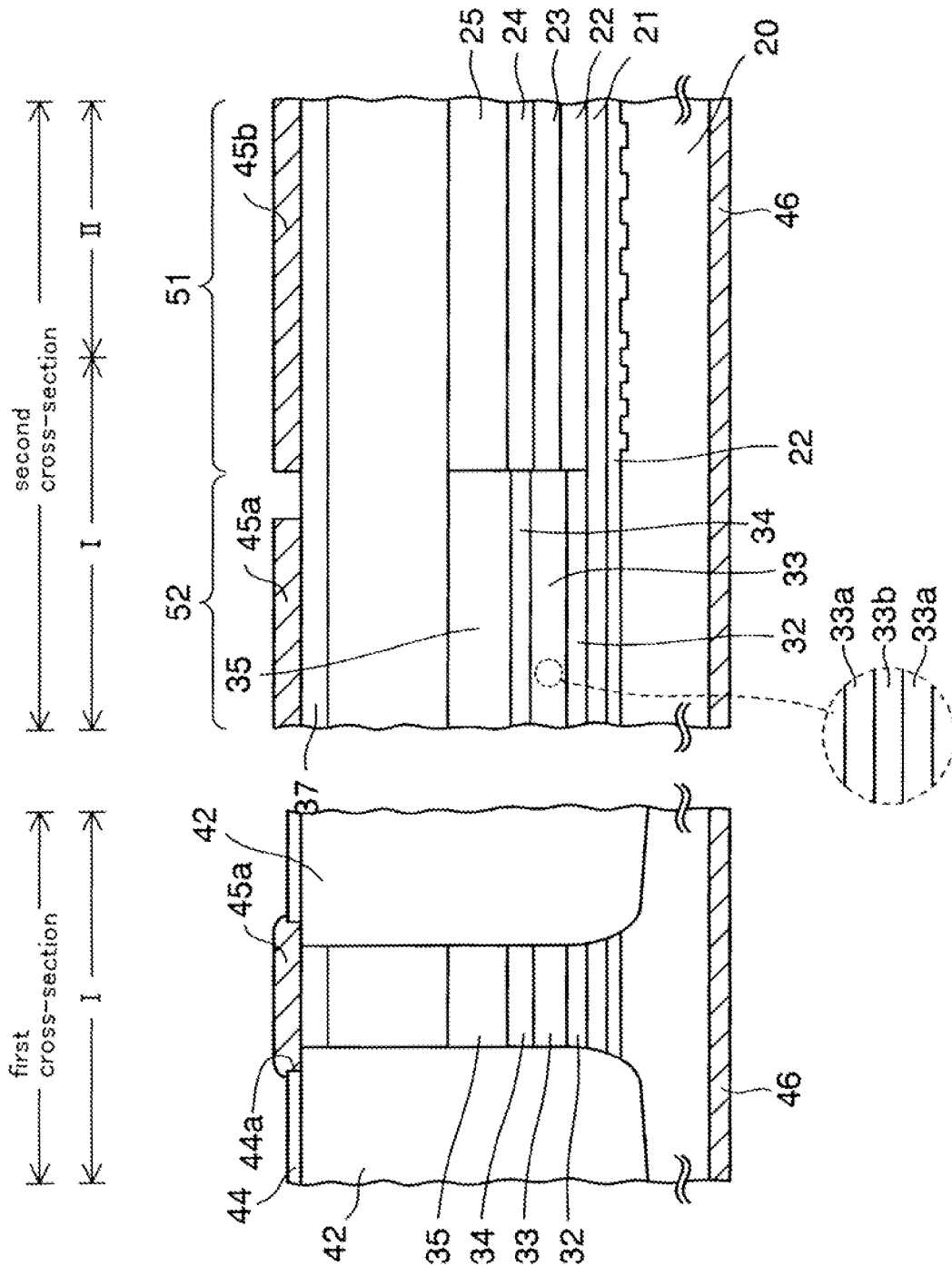
FIG. 10 is a cross-sectional view of an optical semiconductor device according to a fifth embodiment.

FIG. 10 is a cross-sectional view of a semiconductor device according to the present embodiment.

In the first to fourth embodiments, after a DFB laser element having a diffraction grating is formed in the first region I, a semiconductor optical modulator, a semiconductor optical amplifier, or an optical waveguide is integrated in the second region II by butt-joint growth. The present invention is not limited to this configuration. The DFB laser having a diffraction grating may be integrated in a second region II by butt-joint growth, after a semiconductor optical modulator or a semiconductor optical amplifier having a lower cladding layer, a lower AlGaInAs optical guide layer, an AlGaInAs-based multiple quantum well structure, an upper InGaAsP optical guide layer, and an upper InP cladding layer are formed in a first region I. FIG. 10 shows an example in which a semiconductor optical modulator is formed in the first region I and a DFB laser is formed in the second region II.

As the composition and thickness of each layer in the semiconductor optical modulator formed in the first region I, for example, an n-type InGaAsP layer with a composition wavelength of 1.15 µm and a thickness of 70 nm is formed as a diffraction grating buried layer 19 on an n-type InP substrate 20; an n-type InP layer with a thickness of 50 nm is formed as a lower cladding layer 21; an AlGaInAs layer with a composition wavelength of 1.2 µm and a thickness of 50 nm is formed as a modulator lower optical guide layer 32; an AlGaInAs layer with a thickness of 9 nm and a compressive strain of 0.5% is formed as a well layer 33a in the multiple quantum well structure; an AlGaInAs layer with a thickness of 5 nm, a tensile strain of 0.3%, and a composition wavelength of 1.34 µm is formed as a barrier layer 33b in the multiple quantum well structure; an InGaAsP graded layer with a composition wavelength continuously changing from 1.32 µm to 1.00 µm is formed as a modulator upper optical guide layer 34; and a p-type InP layer with a thickness of 150 nm is as a modulator upper cladding layer 35.

(6) Other Embodiments

In the above-described first to fifth embodiments, as described by referring to FIG. 4A, AlGaInAs layers are formed for the well layer 23a and the barrier layer 23b, which constitute the active layer 23 with the multiple quantum well structure.

The present invention is not limited to this configuration. For example, only a barrier layer 23b may be formed of the AlGaInAs layer, and a well layer 23a may be formed of an InGaAs layer or InGaAsP layer. Even with this configuration, the side surface of an active layer 23 does not recede greatly in the etching step of FIG. 4C. Thus, a void can be prevented from being generated in a modulator active layer 33 (see, FIG. 4D) beside the active layer 23 and the like.

Furthermore, in the first to fifth embodiments, an n-type InP substrate, which is a semiconductor, is used. In place of this, a semi-insulating InP substrate may be employed.

In addition, in the above description, a buried structure of the buried layer 42 is employed as a current confinement structure. However, a buried structure of a pnpn structure or of a ridge structure may also be used as the current confinement structure.

Furthermore, as the diffraction grating 20a, a structure having the λ/4 shift 20b in the center thereof is employed in the above. The present invention is not limited to this configuration. For example, the λ/4 shift 20b may also be formed in a position sifted from the center. In addition, the structure may have a uniform diffraction grating without the λ/4 shift 20b.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing an optical semiconductor device, the method comprising:
   forming, on a substrate having first and second regions adjacent to each other, a lower cladding layer, a lower optical guide layer formed of AlGaInAs, an active layer having a multiple quantum well structure in which a barrier layer formed of AlGaInAs and a well layer are alternately stacked, an upper optical guide layer formed of InGaAsP, and an upper cladding layer in this order;
   selectively forming a mask layer on the upper cladding layer in the first region;

selectively etching at least the upper cladding layer in the second region which is not covered with the mask layer;

leaving a first optical semiconductor element in the first region by selectively removing at least the active layer and the lower optical guide layer in the second region which is not covered with the mask layer by wet etching, the first optical semiconductor element being formed of at least the substrate, the lower cladding layer, the lower optical guide layer, the active layer, the upper optical guide layer, and the upper cladding layer;

forming a second optical semiconductor element adjacent to the first optical semiconductor element on the lower cladding layer in the second region after the wet etching; and removing the mask layer.

2. The method for manufacturing an optical semiconductor device according to claim 1, wherein the selective etching of the upper cladding layer is carried out by wet etching using a solution containing hydrochloric acid as an etchant, and the leaving of the first optical semiconductor element in the first region is carried out by wet etching using a solution containing sulfuric acid, hydrogen peroxide water, and water as an etchant.

3. The method for manufacturing an optical semiconductor device according to claim 1, wherein an electroabsorption semiconductor optical modulator is formed as the second optical semiconductor element.

4. The method for manufacturing an optical semiconductor device according to claim 3, wherein the formation of second optical semiconductor element includes:

forming a modulator lower optical guide layer on the lower cladding layer in the second region;

forming a modulator active layer on the modulator lower optical guide layer;

forming a modulator upper optical guide layer on the modulator active layer; and forming a modulator upper cladding layer on the modulator upper optical guide layer.

5. The method for manufacturing an optical semiconductor device according to claim 1, wherein a semiconductor optical amplifier is formed as the second optical semiconductor element.

6. The method for manufacturing an optical semiconductor device according to claim 5, wherein the formation of the second optical semiconductor element includes:

forming an amplifier lower optical guide layer on the lower cladding layer in the second region;

forming an amplifier active layer on the amplifier lower optical guide layer;

forming an amplifier upper optical guide layer on the amplifier active layer; and forming an amplifier upper cladding layer on the amplifier upper optical guide layer.

7. The method for manufacturing an optical semiconductor device according to claim 1, wherein an optical waveguide is formed as the second optical semiconductor element.

8. The method for manufacturing an optical semiconductor device according to claim 7, wherein the formation of the second optical semiconductor element includes:

forming a core layer on the lower cladding layer in the second region; and forming an optical waveguide upper cladding layer on the core layer.

\* \* \* \* \*